US012618921B2

(12) United States Patent
Ota et al.

(10) Patent No.: US 12,618,921 B2
(45) Date of Patent: May 5, 2026

(54) MAGNETIC SENSOR INCLUDING MAGNETIC DETECTION ELEMENT AND MAGNETIC FIELD GENERATOR DISPOSED ON INCLINED SURFACE

(71) Applicant: TDK CORPORATION, Tokyo (JP)

(72) Inventors: Norikazu Ota, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 254 days.

(21) Appl. No.: 18/536,387

(22) Filed: Dec. 12, 2023

(65) Prior Publication Data

US 2024/0201286 A1      Jun. 20, 2024

(30) Foreign Application Priority Data

Dec. 14, 2022    (JP) ................................. 2022-199521

(51) Int. Cl.
*G01R 33/09*      (2006.01)
*G01R 15/20*      (2006.01)
*G01R 19/00*      (2006.01)

(52) U.S. Cl.
CPC ........... *G01R 33/09* (2013.01); *G01R 15/205* (2013.01); *G01R 19/0092* (2013.01)

(58) Field of Classification Search
CPC ... G01R 19/0092; G01R 15/205; G01R 33/09
See application file for complete search history.

(56) References Cited

U.S. PATENT DOCUMENTS

| | | | |
|---|---|---|---|
| 2005/0270020 A1 | 12/2005 | Peczalski et al. | |
| 2006/0176142 A1 | 8/2006 | Naito et al. | |
| 2008/0169807 A1* | 7/2008 | Naito ..................... | G01R 33/09 |
| | | | 257/E27.005 |
| 2013/0257422 A1 | 10/2013 | Koike et al. | |
| 2016/0131687 A1 | 5/2016 | Higashi et al. | |
| 2016/0282144 A1 | 9/2016 | Komasaki | |
| 2016/0370438 A1 | 12/2016 | Komasaki | |

(Continued)

FOREIGN PATENT DOCUMENTS

| | | |
|---|---|---|
| JP | 2006-261400 A | 9/2006 |
| JP | 2012-185044 A | 9/2012 |

(Continued)

OTHER PUBLICATIONS

Translation of Oct. 29, 2024 Office Action issued in Japanese Patent Application No. 2022-199521.

(Continued)

*Primary Examiner* — Alesa Allgood
(74) *Attorney, Agent, or Firm* — Oliff PLC

(57) ABSTRACT
A magnetic sensor includes an insulating layer having a first inclined surface, a plurality of first MR elements disposed on the first inclined surface, and a plurality of first magnetic field generators disposed on the first inclined surface and configured to generate a magnetic field to be applied to the plurality of first MR elements. Each of the plurality of first magnetic field generators includes a ferromagnetic material section and an antiferromagnetic material section. The ferromagnetic material section and the antiferromagnetic material section are stacked in a direction intersecting the first inclined surface.

18 Claims, 27 Drawing Sheets

(56) References Cited

U.S. PATENT DOCUMENTS

2020/0057120 A1 *  2/2020  Belin .................. G01R 33/096
2022/0317208 A1    10/2022  Makino et al.

FOREIGN PATENT DOCUMENTS

| JP | 2017-9400 A | 1/2017 |
|----|-------------|--------|
| JP | 2022-077691 A | 5/2022 |
| WO | 2012/081377 A1 | 6/2012 |

OTHER PUBLICATIONS

Feb. 15, 2025 English Translation of the Office Action issued in
Japanese Patent Application No. 2022-199521.
Feb. 18, 2025 English Translation of the Office Action issued in
Japanese Patent Application No. 2022-199521.

* cited by examiner

3

61C  50C  62C  61C  50C  62C 306
305
304
303
302

301a

301

Z
Y⊗ ⟶X

70

50

70

70

70

D3 → D2

D1

70 70

50

D3 D2

D1

70

73

72

71

D3

D2⊗——▶D1

70

71

72

D3

D2⊗——▶D1

MAGNETIC SENSOR INCLUDING MAGNETIC DETECTION ELEMENT AND MAGNETIC FIELD GENERATOR DISPOSED ON INCLINED SURFACE

CROSS REFERENCE TO RELATED APPLICATIONS

This application claims the benefit of Japanese Priority Patent Application No. 2022-199521 filed on Dec. 14, 2022, the entire contents of which are incorporated herein by reference.

BACKGROUND

The technology relates to a magnetic sensor including a magnetic detection element disposed on an inclined surface.

Magnetic sensors using magnetoresistive elements have been used for various applications in recent years. Examples of the magnetoresistive elements include a spin-valve magnetoresistive element. The spin-valve magnetoresistive element includes a magnetization pinned layer having a magnetization whose direction is fixed, a free layer having a magnetization whose direction is variable depending on the direction of a magnetic field applied thereto, and a gap layer disposed between the magnetization pinned layer and the free layer.

A bias magnetic field can be applied to the magnetoresistive elements of the magnetic sensors for various purposes. For example, JP 2022-77691 A discloses a magnetic sensor including a plurality of bias magnetic field application units that apply respective opposite bias magnetic fields to one part and another part of a free magnetic layer in a giant magnetoresistive element to reduce an offset occurring in the resistance of the free magnetic layer. Each of the plurality of bias magnetic field application units has a structure that a magnetic layer is sandwiched between two antiferromagnetic layers.

US 2016/0131687 A1 discloses a current sensor including a plurality of magnetic bodies that apply respective opposite bias magnetic fields to a magnetization free layer of each of two magnetoresistive elements constituting a full-bridge circuit and a magnetization free layer of each of two other magnetoresistive elements constituting the full-bridge circuit to detect an external magnetic field other than a current magnetic field based on a current to be measured.

U.S. Patent Application Publication No. 2006/0176142 A1 discloses a magnetic sensor including an X-axis sensor, a Y-axis sensor, and a Z-axis sensor disposed on a substrate. Magnetoresistive elements constituting the Z-axis sensor are disposed on slopes of projections formed on an underlying film of the substrate.

Some systems including a magnetic sensor are intended to detect a magnetic field including a component in a direction perpendicular to a substrate surface using magnetoresistive elements disposed on the substrate. In such a case, the magnetoresistive elements can be disposed on an inclined surface of the substrate. If magnetic field generators for applying a bias magnetic field to such magnetoresistive elements are provided, two magnetic field generators can be located with the inclined surface therebetween. In such a case, the bias magnetic field applied to the free layers of the magnetoresistive elements can change in strength or direction if at least either the magnetoresistive elements or the magnetic field generators deviate from their designed positions due to manufacturing variations. Such a problem becomes pronounced if the magnetic field generators include a plurality of layers like the bias magnetic field application units described in JP 2022-77691 A.

SUMMARY

A magnetic sensor according to one embodiment of the technology includes a support member having at least one inclined surface inclined relative to a reference plane, at least one magnetic detection element disposed on the at least one inclined surface and configured to detect a target magnetic field, and at least one magnetic field generator disposed on the at least one inclined surface and configured to generate a magnetic field to be applied to the at least one magnetic detection element. The at least one magnetic field generator includes a ferromagnetic material section and an antiferromagnetic material section that is in contact with the ferromagnetic material section and is in exchange coupling with the ferromagnetic material section. The ferromagnetic material section and the antiferromagnetic material section are stacked in a direction intersecting the at least one inclined surface.

In the magnetic sensor according to one embodiment of the technology, the ferromagnetic material section and the antiferromagnetic material section of the at least one magnetic field generator are stacked in the direction intersecting the at least one inclined surface. According to the embodiment of the technology, a magnetic sensor capable of reducing variations in the magnetic field applied to the magnetic detection element by the magnetic field generator can thereby be implemented.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
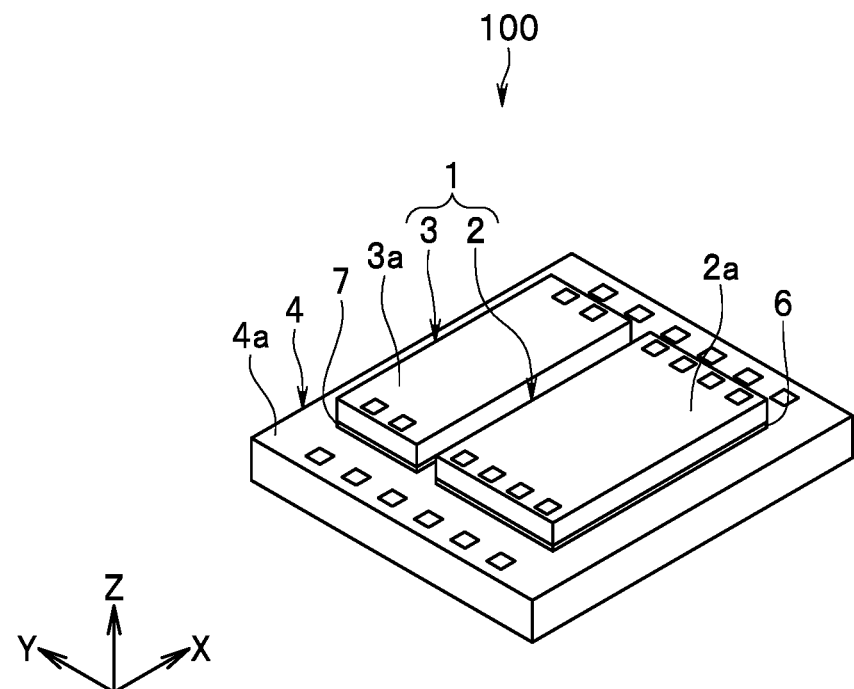
FIG. 1 is a perspective view showing a magnetic sensor device including a magnetic sensor according to a first example embodiment of the technology.

An object of the technology is to provide a magnetic sensor that includes a magnetic detection element disposed on an inclined surface and can reduce variations in a magnetic field applied to the magnetic detection element by a magnetic field generator.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order. [First Example Embodiment]

Figure 2:
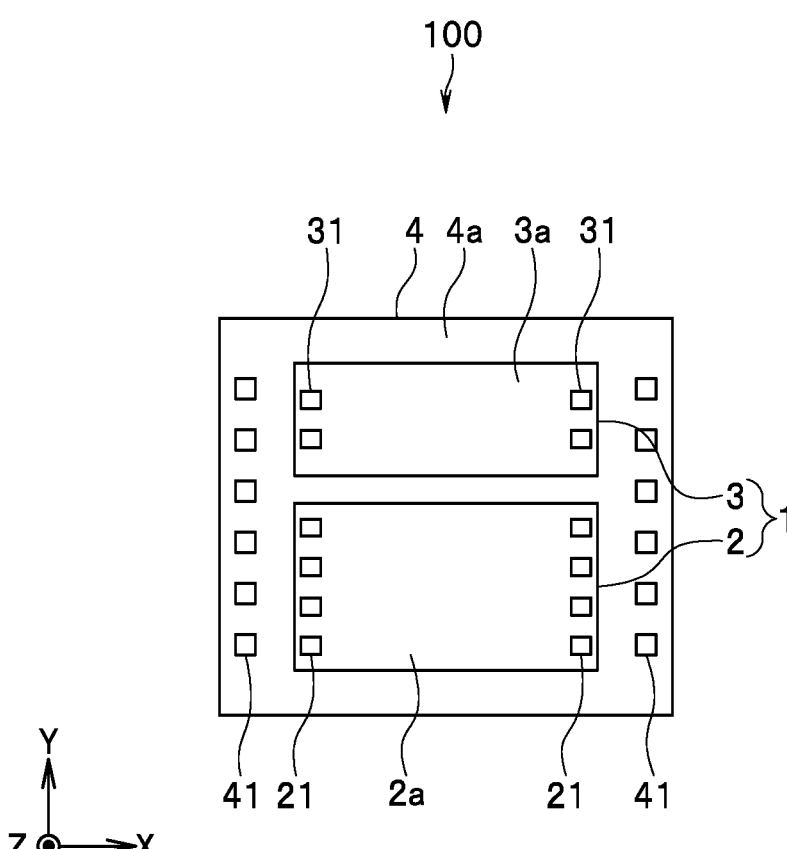
FIG. 2 is a plan view showing the magnetic sensor device shown in FIG. 1.
Figure 3:
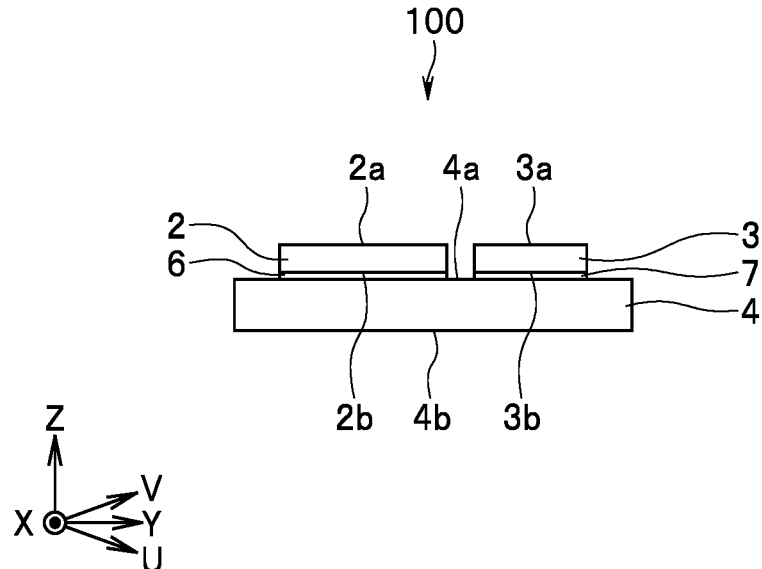
FIG. 3 is a side view showing the magnetic sensor device shown in FIG. 1.
Figure 4:
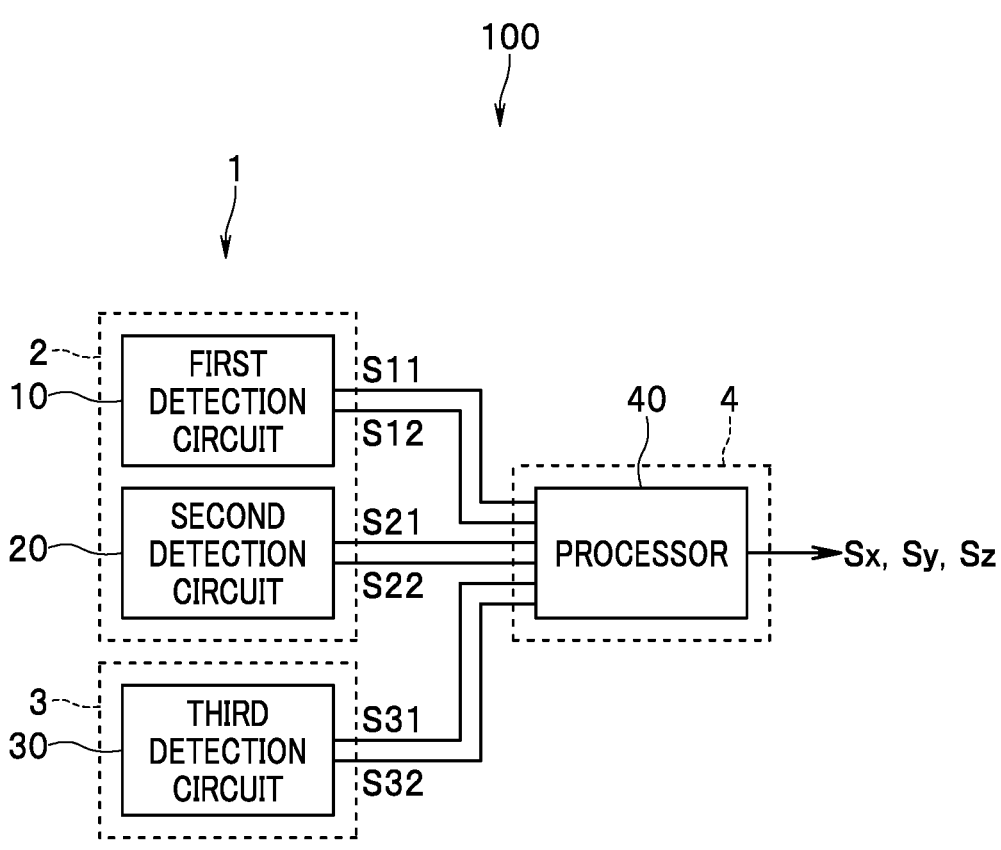
FIG. 4 is a functional block diagram showing a configuration of the magnetic sensor device shown in FIG. 1.

A configuration of a magnetic sensor device including a magnetic sensor according to a first example embodiment of the technology will initially be described with reference to FIGS. 1 to 4. FIG. 1 is a perspective view showing a magnetic sensor device 100. FIG. 2 is a plan view showing the magnetic sensor device 100. FIG. 3 is a side view showing the magnetic sensor device 100. FIG. 4 is a functional block diagram showing a configuration of the magnetic sensor device 100.

The magnetic sensor device 100 includes a magnetic sensor 1 according to the present example embodiment. The magnetic sensor 1 includes a first chip 2 and a second chip 3. The magnetic sensor device 100 further includes a support 4 that supports the first and second chips 2 and 3. The first chip 2, the second chip 3, and the support 4 each have a rectangular solid shape. The support 4 has a reference plane 4a that is a top surface, a bottom surface 4b located opposite to the reference plane 4a, and four side surfaces connecting the reference plane 4a and the bottom surface 4b.

Now, a description will be given of a reference coordinate system in the present example embodiment with reference to FIGS. 1 to 3. The reference coordinate system is an orthogonal coordinate system that is set with reference to a magnetic sensor device 100 and defined by three axes. An X direction, a Y direction, and a Z direction are defined in the reference coordinate system. The X, Y, and Z directions are orthogonal to each other. In particular, in the example embodiment, a direction that is perpendicular to the reference plane 4a of the support 4 and directed from the bottom surface of the support 4 to the reference plane 4a is referred to as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor device 100, the term "top surface" refers to a surface of the component lying at the end thereof in the Z direction, and "bottom surface" refers to a surface of the component lying at the end thereof in the −Z direction. The expression "when seen in the Z direction" means that the intended object is seen from a position at a distance in the Z direction.

As shown in FIG. 3, a U direction and a V direction are defined as follows. The U direction is a direction rotated from the Y direction to the −Z direction. The V direction is a direction rotated from the Y direction to the Z direction. More specifically, in the present example embodiment, the U direction is set to a direction rotated from the Y direction to the −Z direction by a, and the V direction is set to a direction rotated from the Y direction to the Z direction by a. Note that a is an angle greater than 0° and smaller than 90°. −U direction refers to a direction opposite to the U direction, and −V direction refers to a direction opposite to the V direction. The U direction and V direction both are orthogonal to the X direction.

The first chip 2 has a top surface 2a and a bottom surface 2b that are positioned opposite to each other, and four side surfaces connecting the top surface 2a and the bottom surface 2b. The second chip 3 has a top surface 3a and a bottom surface 3b that are positioned opposite to each other, and four side surfaces connecting the top surface 3a and the bottom surface 3b.

The first chip 2 is mounted on the reference plane 4a in a posture such that the bottom surface 2b of the first chip 2 faces the reference plane 4a of the support 4. The second chip 3 is mounted on the reference plane 4a in a posture such that the bottom surface 3b of the second chip 3 faces the reference plane 4a of the support 4. The first chip 2 and the second chip 3 are bonded to the support 4 with, for example, adhesives 6 and 7, respectively.

The first chip 2 has a plurality of first electrode pads 21 disposed on the top surface 2a. The second chip 3 has a plurality of second electrode pads 31 disposed on the top surface 3a. The support 4 has a plurality of third electrode pads 41 disposed on the reference plane 4a. Although not shown, in the magnetic sensor device 100, among the plurality of first electrode pads 21, the plurality of second electrode pads 31, and the plurality of third electrode pads 41, corresponding two electrode pads are connected to each other with bonding wires.

The magnetic sensor 1 includes a first detection circuit 10, a second detection circuit 20, and a third detection circuit 30. The first chip 2 includes the first detection circuit 10 and the second detection circuit 20. The second chip 3 includes the third detection circuit 30.

The magnetic sensor device 100 further includes a processor 40. The support 4 includes the processor 40. The first to third detection circuits 10, 20, and 30 and the processor 40 are connected via a plurality of first electrode pads 21, a plurality of second electrode pads 31, a plurality of third electrode pads 41, and a plurality of bonding wires.

The first to third detection circuits 10, 20, and 30 each include a plurality of magnetic detection elements, and are configured to detect a target magnetic field and generate at least one detection signal. In particular, in the example embodiment, the plurality of magnetic detection elements are a plurality of magnetoresistive elements. The magnetoresistive elements will hereinafter be referred to as MR elements.

The processor 40 is configured to generate a first detection value, a second detection value, and a third detection value by processing the plurality of detection signals generated by the first to third detection circuits 10, 20, and 30. The first, second, and third detection values have a correspondence with components of the magnetic field in three respective different directions at a predetermined reference position. In particular, in the present example embodiment, the foregoing three different directions are two directions parallel to an XY plane and a direction parallel to the Z direction. For example, the processor 40 is constructed of an application-specific integrated circuit (ASIC).

The target magnetic field may be the Earth's magnetic field, for example. In such a case, the first, second, and third detection values have a correspondence with components of the Earth's magnetic field in three respective different directions.

Figure 5:
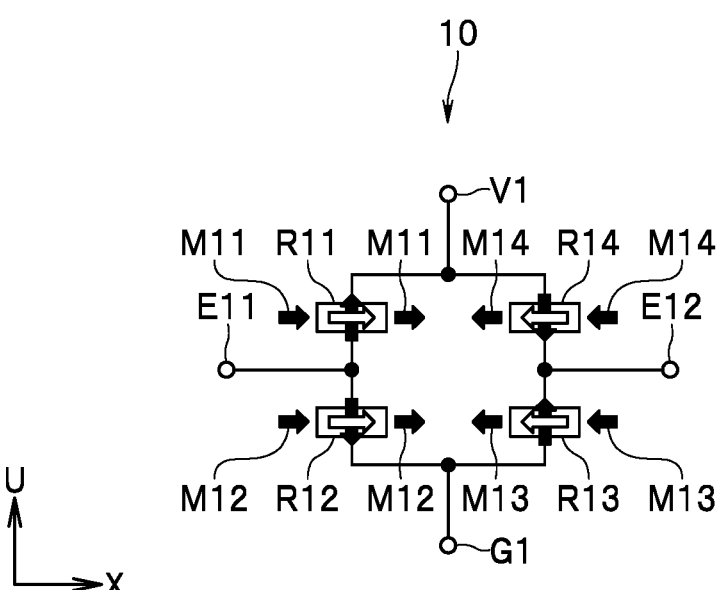
FIG. 5 is a circuit diagram showing a circuit configuration of a first detection circuit of the first example embodiment of the technology.
Figure 6:
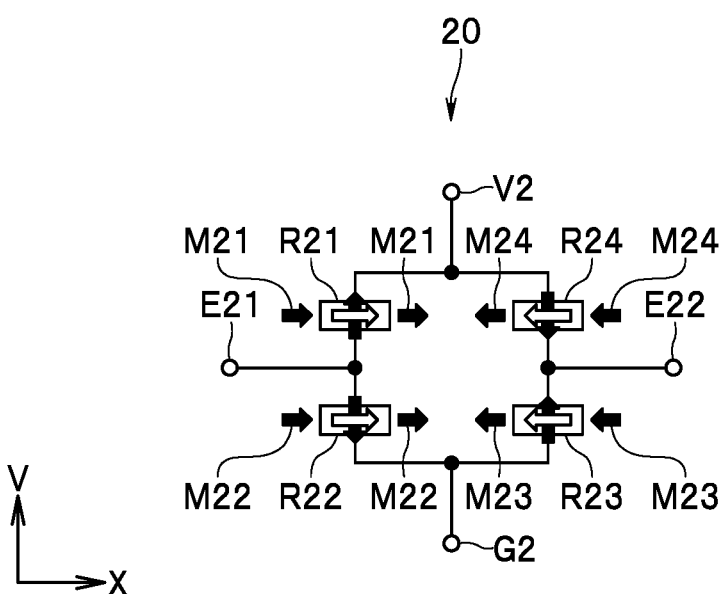
FIG. 6 is a circuit diagram showing a circuit configuration of a second detection circuit of the first example embodiment of the technology.
Figure 7:
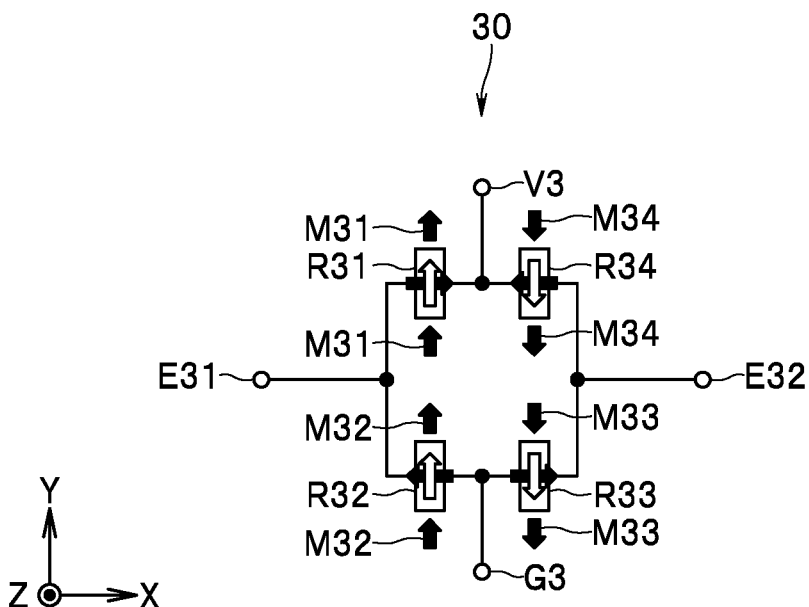
FIG. 7 is a circuit diagram showing a circuit configuration of a third detection circuit of the first example embodiment of the technology.

Next, the first to third detection circuits 10, 20, and 30 will be described with reference to FIGS. 4 to 7. FIG. 5 is a circuit diagram showing a circuit configuration of the first detection circuit 10. FIG. 6 is a circuit diagram showing a circuit configuration of the second detection circuit 20. FIG. 7 is a circuit diagram showing a circuit configuration of the third detection circuit 30.

The first detection circuit 10 is configured to detect a component of the target magnetic field in a direction parallel to the U direction and generate at least one first detection signal which has a correspondence with the component. The second detection circuit 20 is configured to detect a component of the target magnetic field in a direction parallel to the V direction and generate at least one second detection signal which has a correspondence with the component. The third detection circuit 30 is configured to detect a component of the target magnetic field in a direction parallel to the X direction and generate at least one third detection signal which has a correspondence with the component.

As shown in FIG. 5, the first detection circuit 10 includes a power supply port V1, a ground port G1, signal output ports E11 and E12, a first resistor section R11, a second resistor section R12, a third resistor section R13, and a fourth resistor section R14. The plurality of MR elements of the first detection circuit 10 constitute the first to fourth resistor sections R11, R12, R13, and R14.

The first resistor section R11 is provided between the power supply port V1 and the signal output port E11. The second resistor section R12 is provided between the signal output port E11 and the ground port G1. The third resistor section R13 is provided between the signal output port E12 and the ground port G1. The fourth resistor section R14 is provided between the power supply port V1 and the signal output port E12.

As shown in FIG. 6, the second detection circuit 20 includes a power supply port V2, a ground port G2, signal output ports E21 and E22, a first resistor section R21, a second resistor section R22, a third resistor section R23, and a fourth resistor section R24. The plurality of MR elements of the second detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 7, the third detection circuit 30 includes a power supply port V3, a ground port G3, signal output ports E31 and E32, a first resistor section R31, a second resistor section R32, a third resistor section R33, and a fourth resistor section R34. The plurality of MR elements of the third detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of predetermined magnitude is applied to each of the power supply ports V1 to V3. Each of the ground ports G1 to G3 is connected to the ground.

The plurality of MR elements of the first detection circuit 10 will hereinafter be referred to as a plurality of first MR elements 50A. The plurality of MR elements of the second detection circuit 20 will be referred to as a plurality of second MR elements 50B. The plurality of MR elements of the third detection circuit 30 will be referred to as a plurality of third MR elements 50C. Since the first to third detection circuits 10, 20, and 30 are components of the magnetic sensor 1, it can be said that the magnetic sensor 1 includes the plurality of first MR elements 50A, the plurality of second MR elements 50B, and the plurality of third MR elements 50C. Any given MR element will be denoted by the reference numeral 50.

Each MR element 50 may be a spin-valve MR element or an anisotropic magnetoresistive (AMR) element. In particular, in the present example embodiment, each MR element 50 is a spin-valve MR element. The MR element 50 includes a magnetization pinned layer having a magnetization whose direction is fixed, a free layer having a magnetization whose direction is variable depending on the direction of a target magnetic field, and a gap layer located between the magnetization pinned layer and the free layer. The MR element 50 may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the MR element 50 changes with the angle that the magnetization direction of the free layer forms with respect to the magnetization direction of the magnetization pinned layer. The resistance of the MR element 50 is at its minimum value when the foregoing angle is 0°, and at its maximum value when the foregoing angle is 180°. In each MR element 50, the free layer has a shape anisotropy that sets the direction of the magnetization easy axis to be orthogonal to the magnetization direction of the magnetization pinned layer.

In FIGS. 5 to 7, the plurality of solid arrows overlapping the respective resistor sections indicate the magnetization directions of the magnetization pinned layers of the MR elements 50. The plurality of hollow arrows overlapping the respective resistor sections indicate the magnetization directions of the free layers of the MR elements 50 when no target magnetic field is applied to the MR elements 50.

In the example shown in FIG. 5, the magnetization directions of the magnetization pinned layers in each of the first and third resistor sections R11 and R13 are the U direction. The magnetization directions of the magnetization pinned layers in each of the second and fourth resistor sections R12 and R14 are the –U direction. The free layer in each of the plurality of first MR elements 50A has a shape anisotropy that sets the direction of the magnetization easy axis to a direction parallel to the X direction. The magnetization directions of the free layers in each of the first and second resistor sections R11 and R12 in a case where no target magnetic field is applied to the first MR elements 50A are the X direction. The magnetization directions of the free layers in each of the third and fourth resistor sections R13 and R14 in the foregoing case are the –X direction.

In the example shown in FIG. 6, the magnetization directions of the magnetization pinned layers in each of the first and third resistor sections R21 and R23 are the V direction. The magnetization directions of the magnetization pinned layers in each of the second and fourth resistor sections R22 and R24 are the –V direction. The free layer in each of the plurality of second MR elements 50B has a shape anisotropy that sets the direction of the magnetization easy axis to a direction parallel to the X direction. The magnetization directions of the free layers in each of the first and second resistor sections R21 and R22 in a case where no target magnetic field is applied to the second MR elements 50B are the X direction. The magnetization directions of the free layers in each of the third and fourth resistor sections R23 and R24 in the foregoing case are the –X direction.

In the example shown in FIG. 7, the magnetization directions of the magnetization pinned layers in each of the first and third resistor sections R31 and R33 are the X direction. The magnetization directions of the magnetization pinned layers in each of the second and fourth resistor sections R32 and R34 are the –X direction. The free layer in each of the plurality of third MR elements 50C has a shape anisotropy that sets the direction of the magnetization easy axis to a direction parallel to the Y direction. The magnetization directions of the free layers in each of the first and second resistor sections R31 and R32 in a case where no target magnetic field is applied to the third MR elements 50C are the Y direction. The magnetization directions of the free layers in each of the third and fourth resistor sections R33 and R34 in the foregoing case are the –Y direction.

The magnetic sensor 1 further includes at least one magnetic field generator that generates a magnetic field to be applied to the at least one MR element 50. In particular, in the example embodiment, the at least one magnetic field generator includes a plurality of magnetic field generators. In FIG. 5, the arrows denoted by the symbols M11, M12, M13, and M14 indicate the directions of the magnetic fields applied to the plurality of first MR elements 50A by a plurality of magnetic field generators. In the first and second resistor sections R11 and R12, a magnetic field in the X direction is applied to the plurality of first MR elements 50A by the plurality of magnetic field generators. In the third and fourth resistor sections R13 and R14, a magnetic field in the –X direction is applied to the plurality of first MR elements 50A by the plurality of magnetic field generators.

In FIG. 6, the arrows denoted by the symbols M21, M22, M23, and M24 indicate the directions of the magnetic fields applied to the plurality of second MR elements 50B by a plurality of magnetic field generators. In the first and second resistor sections R21 and R22, a magnetic field in the X direction is applied to the plurality of second MR elements 50B by the plurality of magnetic field generators. In the third and fourth resistor sections R23 and R24, a magnetic field in the –X direction is applied to the plurality of second MR elements 50B by the plurality of magnetic field generators.

In FIG. 7, the arrows denoted by the symbols M31, M32, M33, and M34 indicate the directions of the magnetic fields applied to the plurality of third MR elements 50C by a plurality of magnetic field generators. In the first and second resistor sections R31 and R32, a magnetic field in the Y direction is applied to the plurality of third MR elements 50C by the plurality of magnetic field generators. In the third and fourth resistor sections R33 and R34, a magnetic field in the –Y direction is applied to the plurality of third MR elements 50C by the plurality of magnetic field generators.

In view of factors such as the production accuracy of the MR elements 50 and the magnetic field generators, the magnetization directions of the magnetization pinned layers, the directions of the magnetization easy axes of the free layers, and the directions of the magnetic fields applied to the MR elements 50 by the plurality of magnetic field generators may be slightly different from the foregoing directions. The magnetization pinned layers may be magnetized to include magnetization components having the foregoing directions as their main components. In such a case, the magnetization directions of the magnetization pinned layers are the same or substantially the same as the foregoing directions.

Next, the first to third detection signals will be described. The first detection signal will initially be described with reference to FIG. 5. As the strength of the component of the target magnetic field in the direction parallel to the U direction changes, the resistance of each of the resistor sections R11 to R14 of the first detection circuit 10 changes either so that the resistances of the resistor sections R11 and R13 increase and the resistances of the resistor sections R12 and R14 decrease or so that the resistances of the resistor sections R11 and R13 decrease and the resistances of the resistor sections R12 and R14 increase. Thereby the electric potential of each of the signal output ports E11 and E12 changes. The first detection circuit 10 generates a signal corresponding to the electric potential of the signal output port E11 as a first detection signal S11, and generates a signal corresponding to the electric potential of the signal output port E12 as a first detection signal S12.

Next, the second detection signal will be described with reference to FIG. 6. As the strength of the component of the target magnetic field in the direction parallel to the V direction changes, the resistance of each of the resistor sections R21 to R24 of the second detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The second detection circuit 20 generates a signal corresponding to the electric potential of the signal output port E21 as a second detection signal S21, and generates a signal corresponding to the electric potential of the signal output port E22 as a second detection signal S22.

Next, the third detection signal will be described with reference to FIG. 7. As the strength of the component of the target magnetic field in the direction parallel to the X direction changes, the resistance of each of the resistor sections R31 to R34 of the third detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The third detection circuit 30 generates a signal corresponding to the electric potential of the signal output port E31 as a third detection signal S31, and generates a signal corresponding to the electric potential of the signal output port E32 as a third detection signal S32.

Next, an operation of the processor 40 will be described. The processor 40 is configured to generate the first detection value and the second detection value based on the first detection signals S11 and S12, and the second detection signals S21 and S22. The first detection value is a detection value corresponding to the component of the target magnetic field in the direction parallel to the Y direction. The second detection value is a detection value corresponding to the component of the target magnetic field in the direction parallel to the Z direction. Hereinafter, the first detection value is represented by a symbol Sy, and the second detection value is represented by a symbol Sz.

The processor 40 generates the first and second detection values Sy and Sz as follows, for example. First, the processor 40 generates a value S1 by an arithmetic including obtainment of the difference S11-S12 between the first detection signal S11 and the first detection signal S12, and generates a value S2 by an arithmetic including obtainment of the difference S21-S22 between the second detection signal S21 and the second detection signal S22. Next, the processor 40 calculates values S3 and S4 using the following expressions (1) and (2).

$$S3 = (S2 + S1)/(2\cos\alpha) \tag{1}$$

$$S4 = (S2 - S1)/(2\sin\alpha) \tag{2}$$

The first detection value Sy may be the value S3 itself, or may be a result of predetermined corrections, such as a gain adjustment and an offset adjustment, made to the value S3. In the same manner, the second detection value Sz may be the value S4 itself, or may be a result of predetermined corrections, such as a gain adjustment and an offset adjustment, made to the value S4.

The processor 40 is further configured to generate the third detection value based on the third detection signals S31 and S32. The third detection value is a detection value corresponding to the component of the target magnetic field in the direction parallel to the X direction. The third detection value will hereinafter be represented by the symbol Sx.

In the present example embodiment, the processor 40 generates the third detection value Sx by an arithmetic including obtainment of a difference S31-S32 between the third detection signal S31 and the third detection signal S32. The third detection value Sx may be the difference S31-S32 itself. The third detection value Sx may be a result of predetermined corrections, such as a gain adjustment and an offset adjustment, made on the difference S31-S32.

Figure 8:
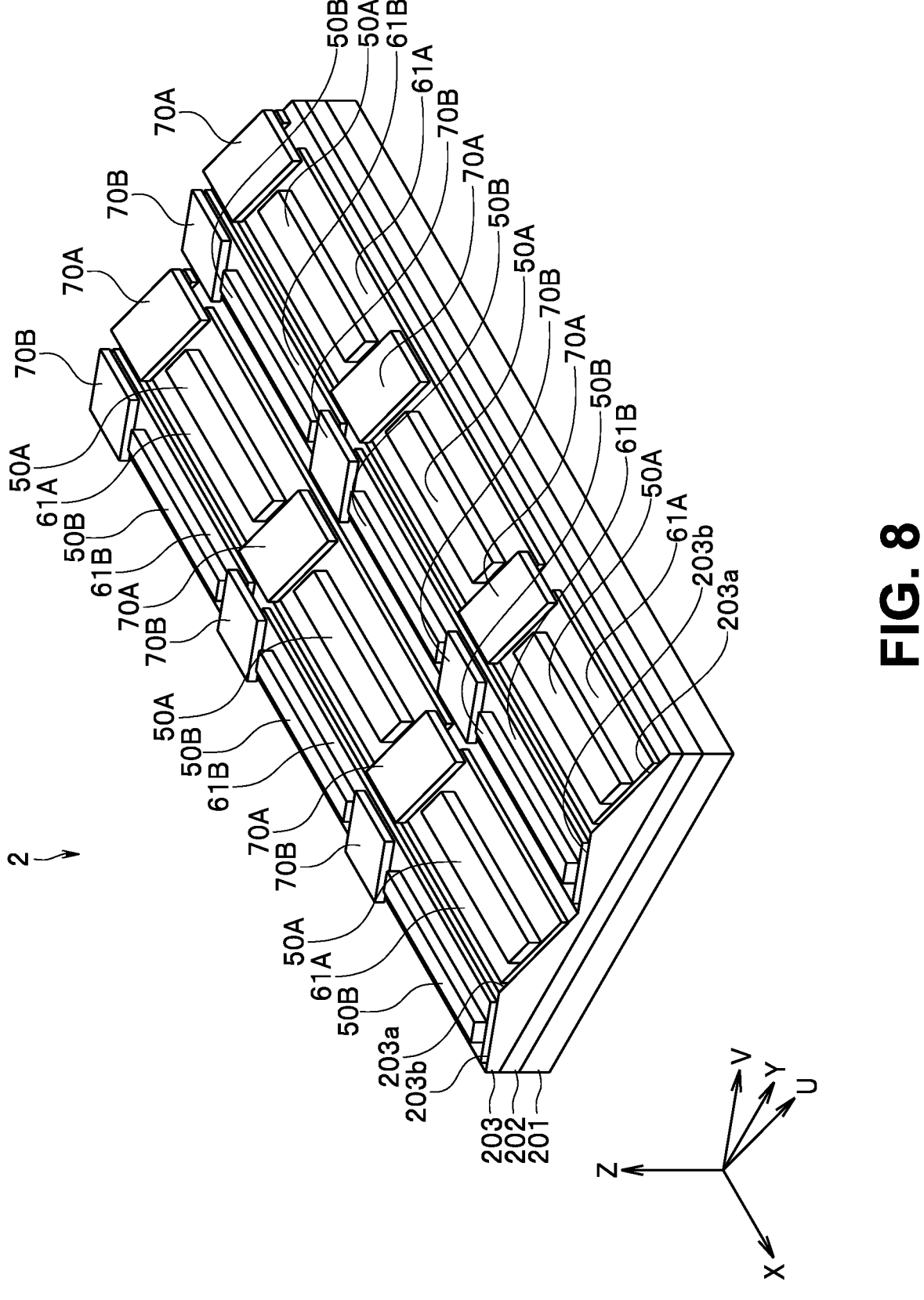
FIG. 8 is a perspective view showing a part of a first chip of the first example embodiment of the technology.
Figure 9:
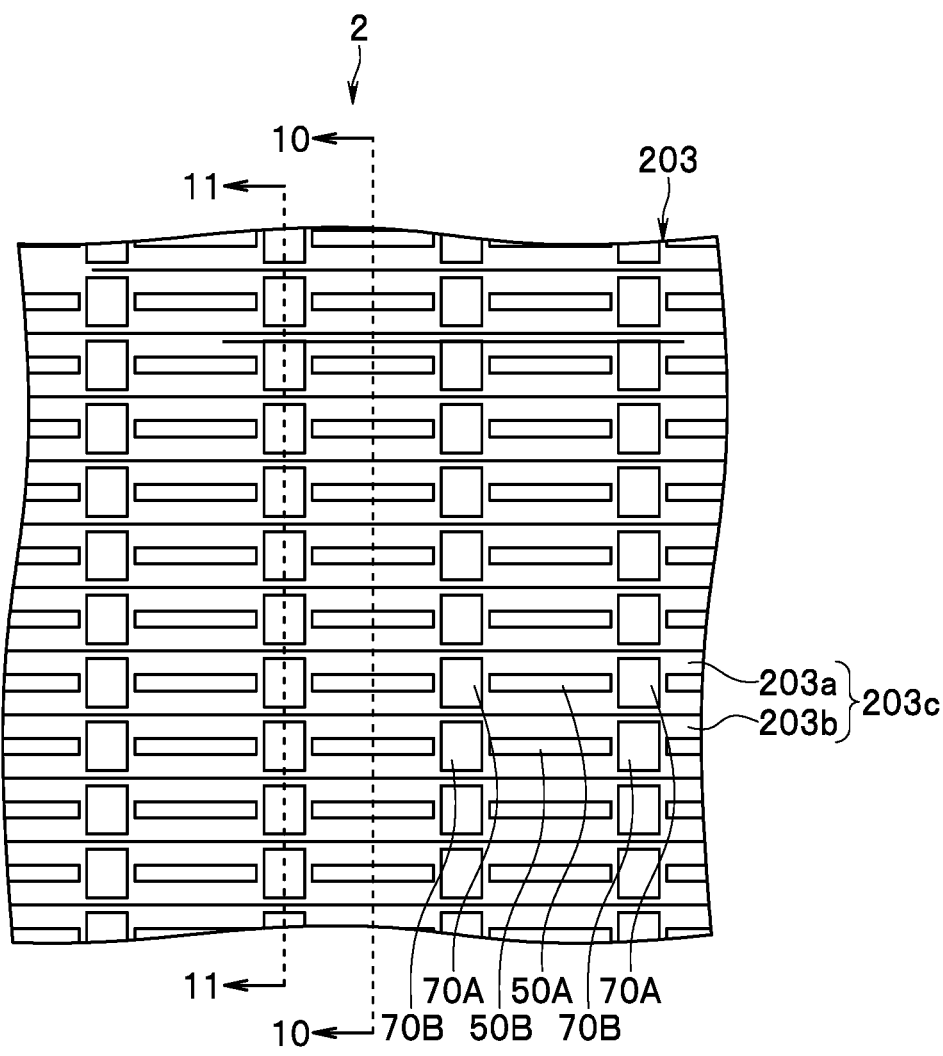
FIG. 9 is a plan view showing a part of the first chip of the first example embodiment of the technology.
Figure 9:
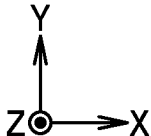
Figure 10:
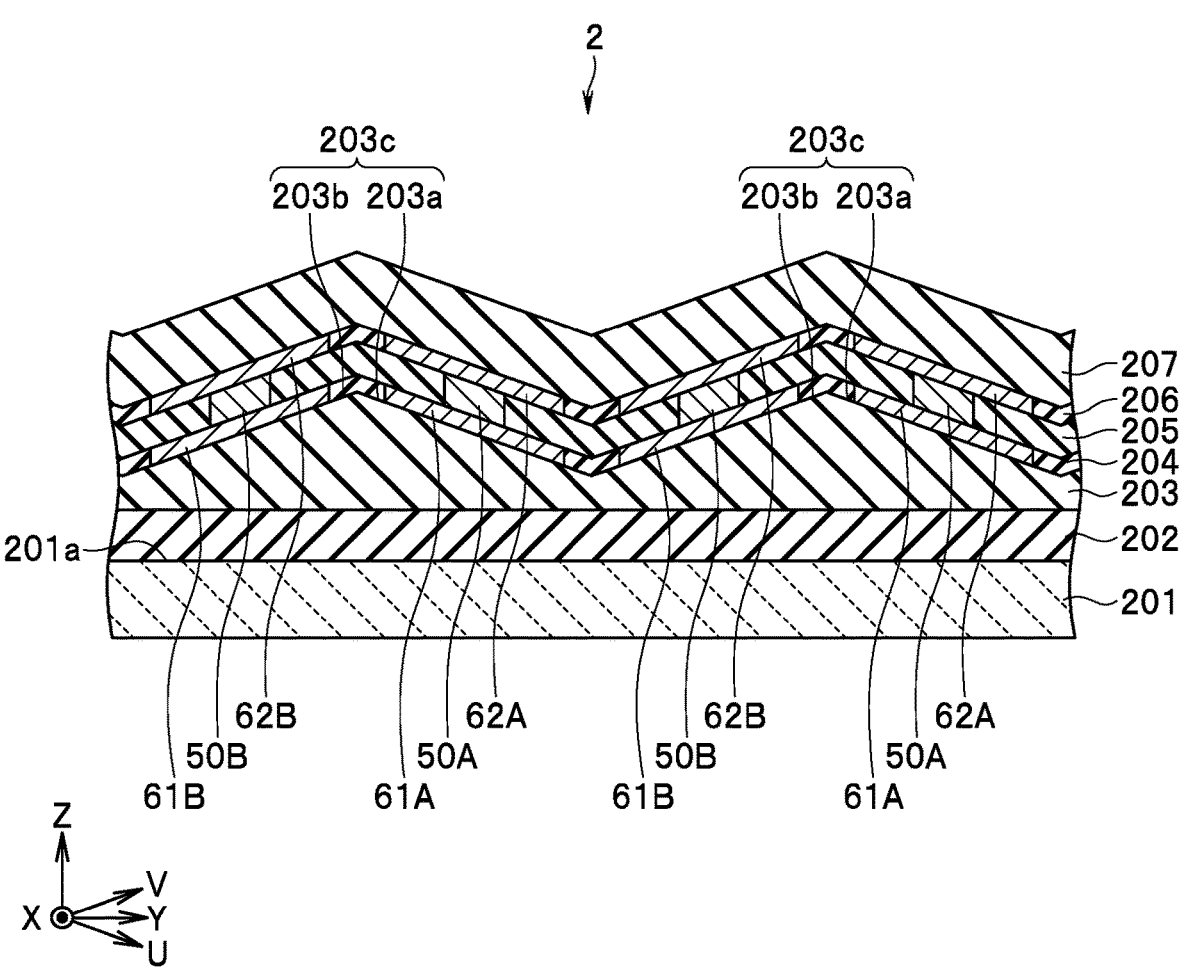
FIG. 10 is a sectional view showing a part of the first chip of the first example embodiment of the technology.
Figure 11:
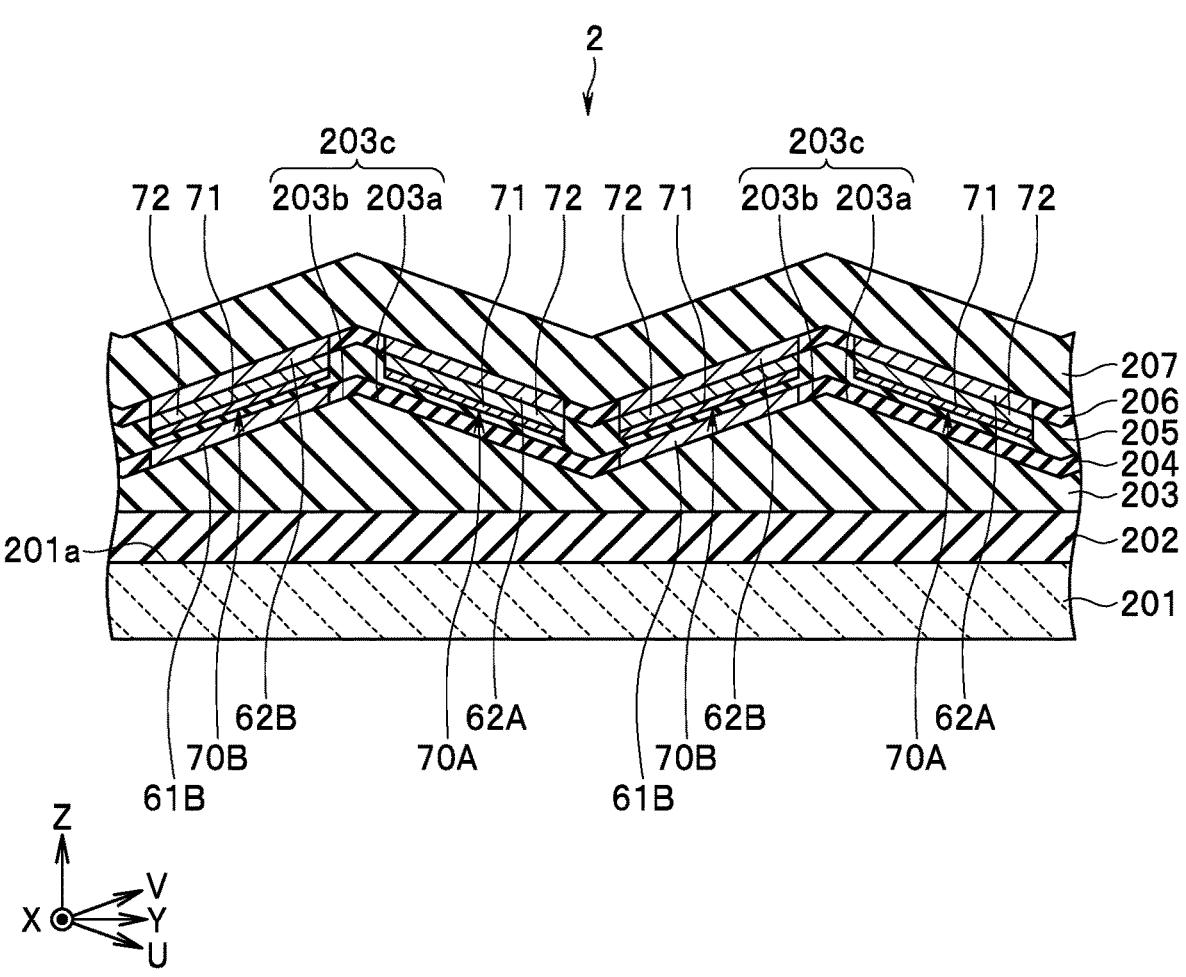
FIG. 11 is another sectional view showing a part of the first chip of the first example embodiment of the technology.

Next, a structure of the first chip 2 will be described with reference to FIGS. 8 to 11. FIG. 8 is a perspective view showing a part of the first chip 2. FIG. 9 is a plan view showing a part of the first chip 2. FIGS. 10 and 11 are sectional views showing a part of the first chip 2. FIG. 10 shows a part of a cross section at the position indicated by the line 10-10 in FIG. 9. FIG. 11 shows a part of a cross section at the position indicated by the line 11-11 in FIG. 9.

The first chip 2 includes a substrate 201 having a top surface 201a, insulating layers 202, 203, 204, 205, 206, and 207, a plurality of lower electrodes 61A, a plurality of lower electrodes 61B, a plurality of upper electrodes 62A, a plurality of upper electrodes 62B, a plurality of first magnetic field generators 70A, and a plurality of second magnetic field generators 70B. The top surface 201a of the substrate 201 is parallel to the XY plane. The Z direction is also a direction perpendicular to the top surface 201a of the substrate 201.

The insulating layers 202 and 203 are stacked in this order on the substrate 201. The plurality of lower electrodes 61A and the plurality of lower electrodes 61B are disposed on the insulating layer 203. The insulating layer 204 is disposed around the plurality of lower electrodes 61A and around the plurality of lower electrodes 61B on the insulating layer 203. The plurality of first MR elements 50A are disposed on the plurality of lower electrodes 61A. The plurality of second MR elements 50B are disposed on the plurality of lower electrodes 61B. The insulating layer 205 is disposed around the plurality of first MR elements 50A and around the plurality of second MR elements 50B on the plurality of lower electrodes 61A, the plurality of lower electrodes 61B, and the insulating layer 204. The plurality of upper electrodes 62A are disposed on the plurality of first MR elements 50A and the insulating layer 205. The plurality of upper electrodes 62B are disposed on the plurality of second MR elements 50B and the insulating layer 205. The insulating layer 206 is disposed around the plurality of upper electrodes 62A and around the plurality of upper electrodes 62B on the insulating layer 205. The insulating layer 207 is disposed on the plurality of upper electrodes 62A, the plurality of upper electrodes 62B, and the insulating layer 206.

The plurality of first magnetic field generators 70A and the plurality of second magnetic field generators 70B are embedded in the insulating layer 205. Each of the plurality of first magnetic field generators 70A is located at predetermined distances from the first MR elements 50A and the lower electrodes 61A. Each of the plurality of second magnetic field generators 70B is located at predetermined distances from the second MR elements 50B and the lower electrodes 61B. The insulating layer 205 may include insulating films interposed between each of the plurality of first magnetic field generators 70A and each of the plurality of first MR elements 50A, between each of the plurality of second magnetic field generators 70B and each of the plurality of second MR elements 50B, between each of the plurality of first magnetic field generators 70A and each of the plurality of lower electrodes 61A, and between each of the plurality of second magnetic field generators 70B and each of the plurality of lower electrodes 61B.

The top surfaces of some of the plurality of first magnetic field generators 70A may be in contact with the bottom surfaces of the plurality of upper electrodes 62A. The top surfaces of some of the plurality of second magnetic field generators 70B may be in contact with the bottom surfaces of the plurality of upper electrodes 62B.

The first chip 2 includes a support member that supports the plurality of first MR elements 50A and the plurality of second MR elements 50B. The support member has at least one inclined surface inclined relative to the top surface 201a of the substrate 201. In particular, in the present example embodiment, the support member includes the insulating layer 203.

The insulating layer 203 includes a plurality of protruding surfaces 203c each protruding in a direction away from the top surface 201a of the substrate 201 (Z direction). The plurality of protruding surfaces 203c each extend in the direction parallel to the X direction. The overall shape of each protruding surface 203c is a triangular roof shape. The plurality of protruding surfaces 203c are arranged in the direction parallel to the Y direction.

Now, focus is placed on arbitrarily-chosen one of the protruding surfaces 203c. The protruding surface 203c includes a first inclined surface 203a and a second inclined surface 203b. The first inclined surface 203a is a surface forming a part of the protruding surface 203c on the side of the Y direction. The second inclined surface 203b is a surface forming a part of the protruding surface 203c on the side of the −Y direction. The first and second inclined surfaces 203a and 203b each have a shape long in the direction parallel to the X direction.

The top surface 201a of the substrate 201 is parallel to the XY plane. The reference plane 4a is parallel to the XY plane. The first inclined surface 203a and the second inclined surface 203b are each inclined relative to each of the top surface 201a of the substrate 201 and the reference plane 4a. The second inclined surface 203b faces a direction different from the first inclined surface 203a. A gap between the first inclined surface 203a and the second inclined surface 203b in a YZ cross section perpendicular to the top surface 201a of the substrate 201 becomes smaller in the direction away from the top surface 201a of the substrate 201.

In the example embodiment, there are plurality of protruding surfaces 203c, and thus there are a plurality of first inclined surfaces 203a and a plurality of second inclined surfaces 203b. The insulating layer 203 includes the plurality of first inclined surfaces 203a and the plurality of second inclined surfaces 203b.

The plurality of lower electrodes 61A are disposed on the plurality of first inclined surfaces 203a. The plurality of lower electrodes 61B are disposed on the plurality of second inclined surfaces 203b. As describe above, the first and second inclined surfaces 203a and 203b are each inclined relative to the top surface 201a of the substrate 201, i.e., the XY plane. The top surface of each of the plurality of lower electrodes 61A and the top surface of each of the plurality of lower electrode 61B are thus also inclined relative to the XY plane. The reference plane 4a is parallel to the XY plane. Thus, it can be said that the plurality of first MR elements 50A and the plurality of second MR elements 50B are disposed on the inclined surfaces inclined relative to the reference plane 4a. The insulating layer 203 is a member for supporting each of the plurality of first MR elements 50A and the plurality of second MR elements 50B so as to allow each of the MR elements to be inclined relative to the reference plane 4a.

Each of the plurality of first MR elements 50A has a bottom surface shaped along each of the first inclined surfaces 203a. Each of the plurality of second MR elements 50B has a bottom surface shaped along each of the second inclined surfaces 203b. Now, focus is placed on an arbitrarily-chosen one of the plurality of first MR elements 50A and an arbitrarily-chosen one of the plurality of second MR elements 50B. The arbitrarily-chosen first MR element 50A and the arbitrarily-chosen second MR element 50B are not located on the same plane.

The plurality of first magnetic field generators 70A are substantially disposed on the plurality of first inclined surfaces 203a, but not on the plurality of second inclined surfaces 203b. Each of the plurality of first magnetic field generators 70A has a bottom surface that is shaped along each of the first inclined surfaces 203a and has substantially the same shape as that of the bottom surface of each of the first MR elements 50A at least in part.

The plurality of second magnetic field generators 70B are substantially disposed on the plurality of second inclined surfaces 203b, but not on the plurality of first inclined surfaces 203a. Each of the plurality of second magnetic field generators 70B has a bottom surface that is shaped along each of the second inclined surfaces 203b and has substantially the same shape as that of the bottom surface of each of the second MR elements 50B at least in part.

Now, focus is placed on an arbitrarily-chosen one of the plurality of first magnetic field generators 70A and an arbitrarily-chosen one of the plurality of second magnetic field generators 70B. The arbitrarily-chosen first magnetic field generator 70A and the arbitrarily-chosen second magnetic field generator 70B are not located on the same plane.

Although not shown, the insulating layer 203 further includes a flat surface present around the plurality of protruding surfaces 203c. The plurality of protruding surfaces 203c may protrude from the flat surface in the Z direction. The plurality of protruding surfaces 203c may be disposed with predetermined gaps therebetween so that a flat surface is formed between two adjoining protruding surfaces 203c. Alternatively, the insulating layer 203 may have groove portions recessed from the flat surface in the −Z direction. In such a case, the plurality of protruding surfaces 203c may be present in the groove portions.

As shown in FIGS. 8 and 9, the plurality of first magnetic field generators 70A are arranged several in rows in both the X and Y directions. Each of the plurality of first MR elements 50A is located between two first magnetic field generators 70A adjoining in the direction parallel to the X direction. Several first MR elements 50A and several first magnetic field generators 70A are arranged in rows on one first inclined surface 203a.

Similarly, the plurality of second magnetic field generators 70B are arranged several in rows in both the X and Y directions. Each of the plurality of second MR elements 50B is located between two second magnetic field generators 70B adjoining in the direction parallel to the X direction. Several second MR elements 50B and several second magnetic field generators 70B are arranged in rows on one second inclined surface 203b.

The rows of first MR elements 50A and first magnetic field generators 70A and the rows of second MR elements 50B and second magnetic field generators 70B are alternately arranged in the direction parallel to the Y direction.

Figure 16:
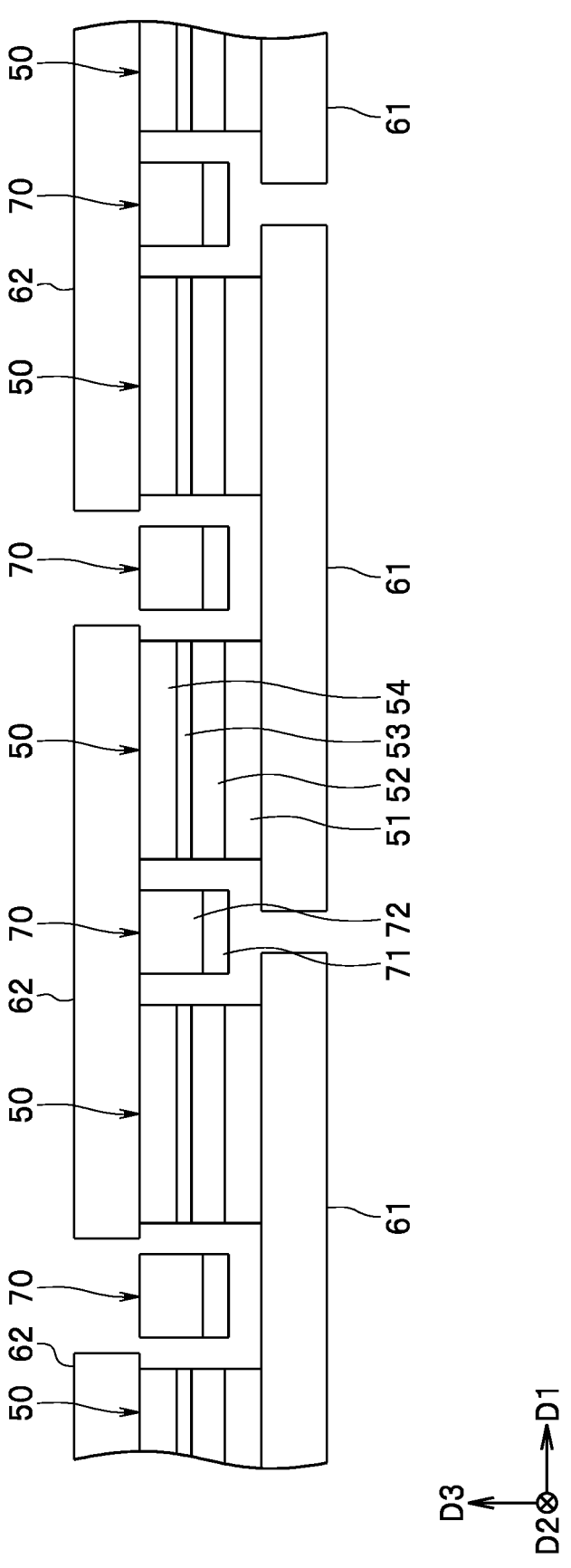
FIG. 16 is a side view showing magnetoresistive elements and magnetic field generators of the first example embodiment of the technology.

The plurality of first MR elements 50A are connected in series by the plurality of lower electrodes 61A and the plurality of upper electrodes 62A. A method for connecting the plurality of first MR elements 50A will now be described in detail with reference to FIG. 16. In FIG. 16, the reference numerals 61 denote lower electrodes corresponding to given MR elements 50, and the reference numerals 62 denote upper electrodes corresponding to the MR elements 50. In FIG. 16, the reference numeral 70 denotes any given magnetic field generator.

As shown in FIG. 16, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

A magnetic field generator 70 is located between two MR elements 50 adjoining in the longitudinal direction of the lower electrodes 61. There are gaps between the magnetic field generator 70, the MR elements 50, and the lower electrodes 61. The magnetic field generator 70 may or may not be in contact with the upper electrodes 62.

Although not shown in the drawings, an MR element 50 located at the end of a row of MR elements 50 is connected to another MR element 50 located at the end of another row of MR elements 50 adjoining in a direction intersecting with the longitudinal direction of the lower electrodes 61. The two MR elements 50 are connected to each other by a not-shown electrode. The not-shown electrode may be an electrode connecting the bottom surfaces of the two MR elements 50 or the top surfaces of the same.

If the MR elements 50 in FIG. 16 are the first MR elements 50A, the lower electrodes 61, the upper electrodes 62, and the magnetic field generators 70 in FIG. 16 correspond to the lower electrodes 61A, the upper electrodes 62A, and the first magnetic field generators 70A, respectively. If the MR elements 50 in FIG. 16 are the second MR elements 50B, the lower electrodes 61, the upper electrodes 62, and the magnetic field generators 70 in FIG. 16 correspond to the lower electrodes 61B, the upper electrodes 62B, and the second magnetic field generators 70B, respectively.

Now, the definitions of a first direction D1, a second direction D2, and a third direction D3 shown in FIG. 16 will be described. The first direction D1, the second direction D2, and the third direction D3 are orthogonal to each other. The first direction D1 is a direction parallel to the longitudinal direction of the lower electrodes 61 (the same as the longitudinal direction of the upper electrodes 62). The third direction D3 is a direction from the lower electrodes 61 to the upper electrodes 62.

If the MR elements 50 shown in FIG. 16 are the first MR elements 50A, the first direction D1 is the X direction or the −X direction. The second direction D2 is the U direction or the −U direction. The third direction D3 is a direction intersecting the first inclined surfaces 203a. If the MR elements 50 shown in FIG. 16 are the second MR elements 50B, the first direction D1 is the X direction or the −X direction. The second direction is the V direction or the −V direction. The third direction D3 is a direction intersecting the second inclined surfaces 203b.

Figure 12:
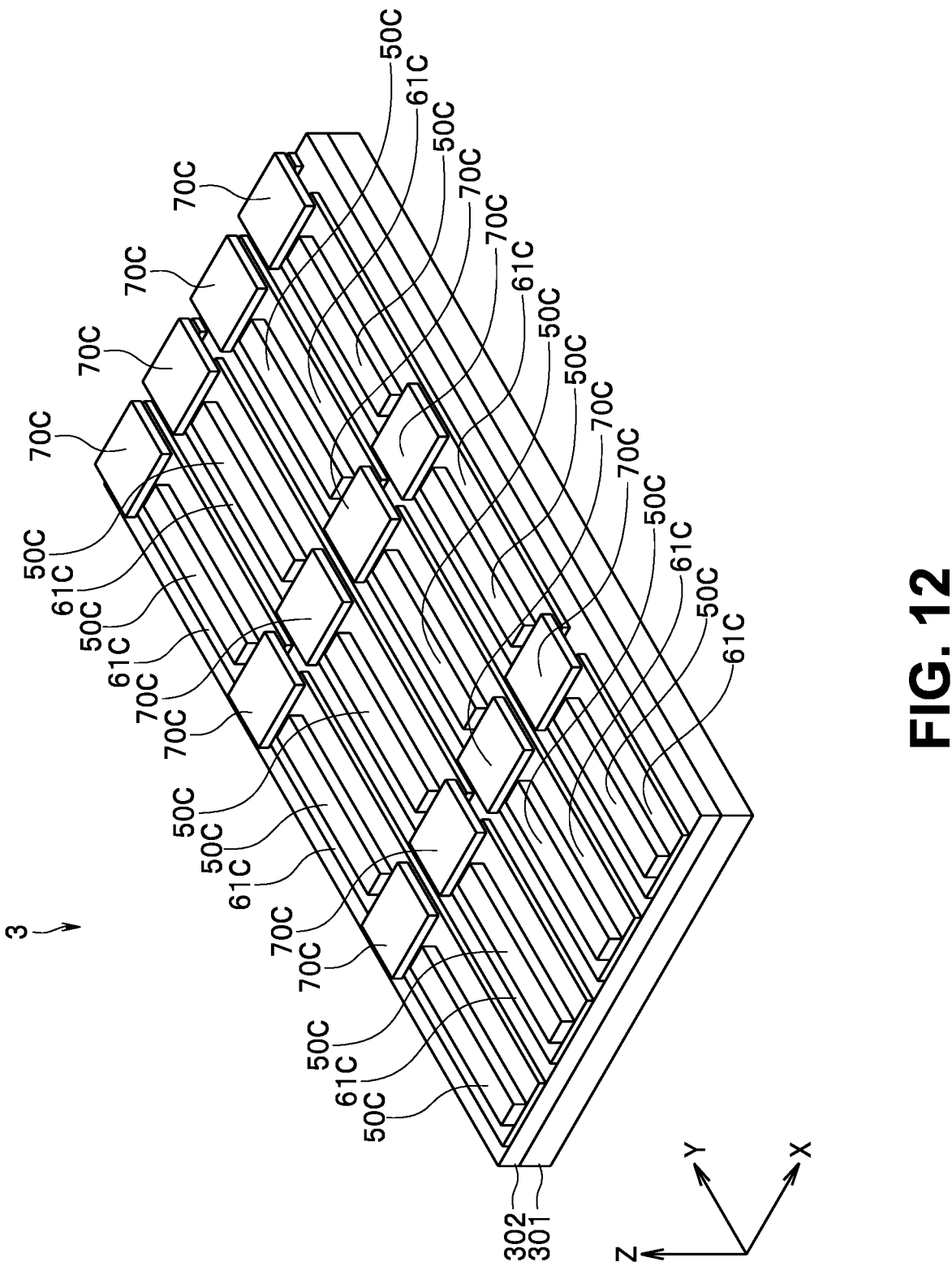
FIG. 12 is a perspective view showing a part of a second chip of the first example embodiment of the technology.
Figure 13:
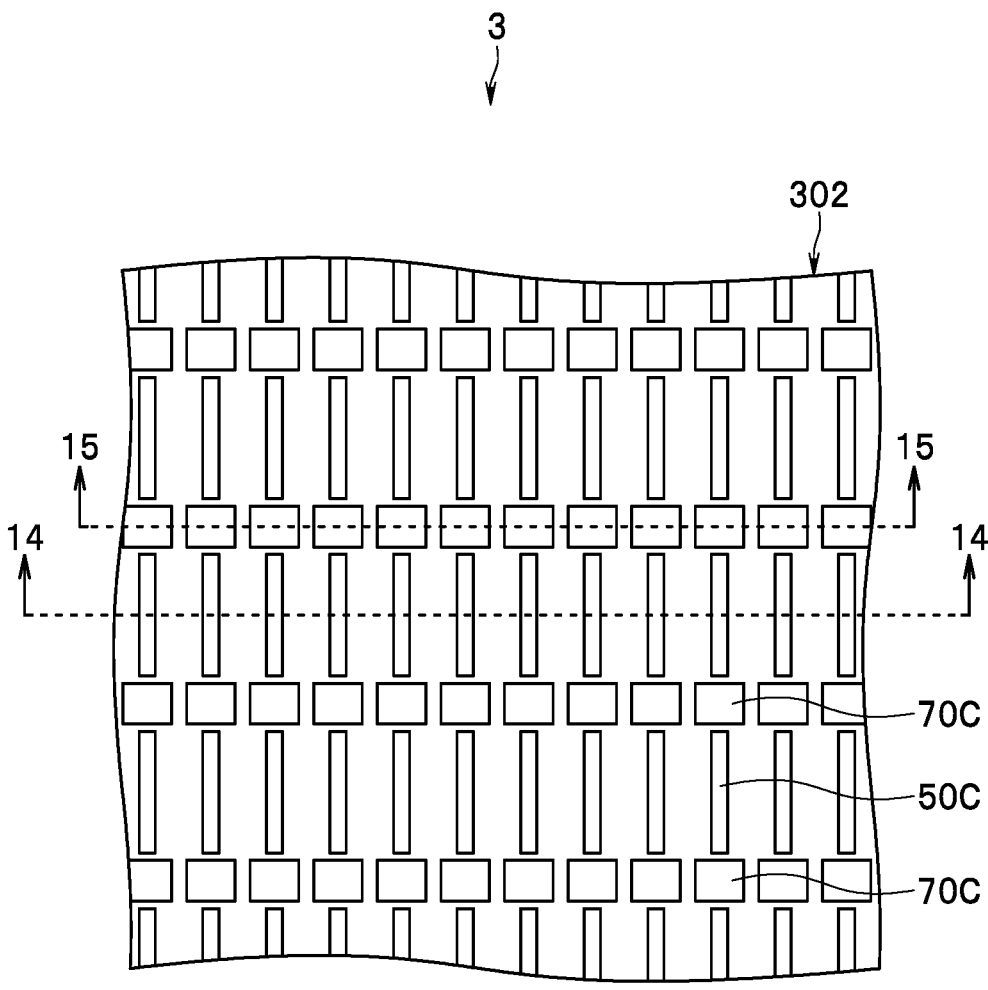
FIG. 13 is a plan view showing a part of the second chip of the first example embodiment of the technology.
Figure 13:
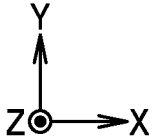
Figure 14:
FIG. 14 is a sectional view showing a part of the second chip of the first example embodiment of the technology.
Figure 14:
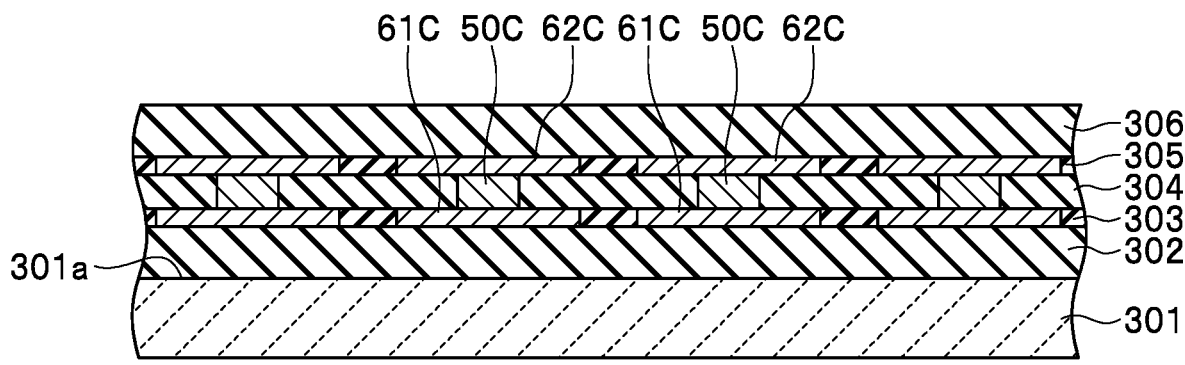
Figure 14:
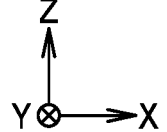
Figure 15:
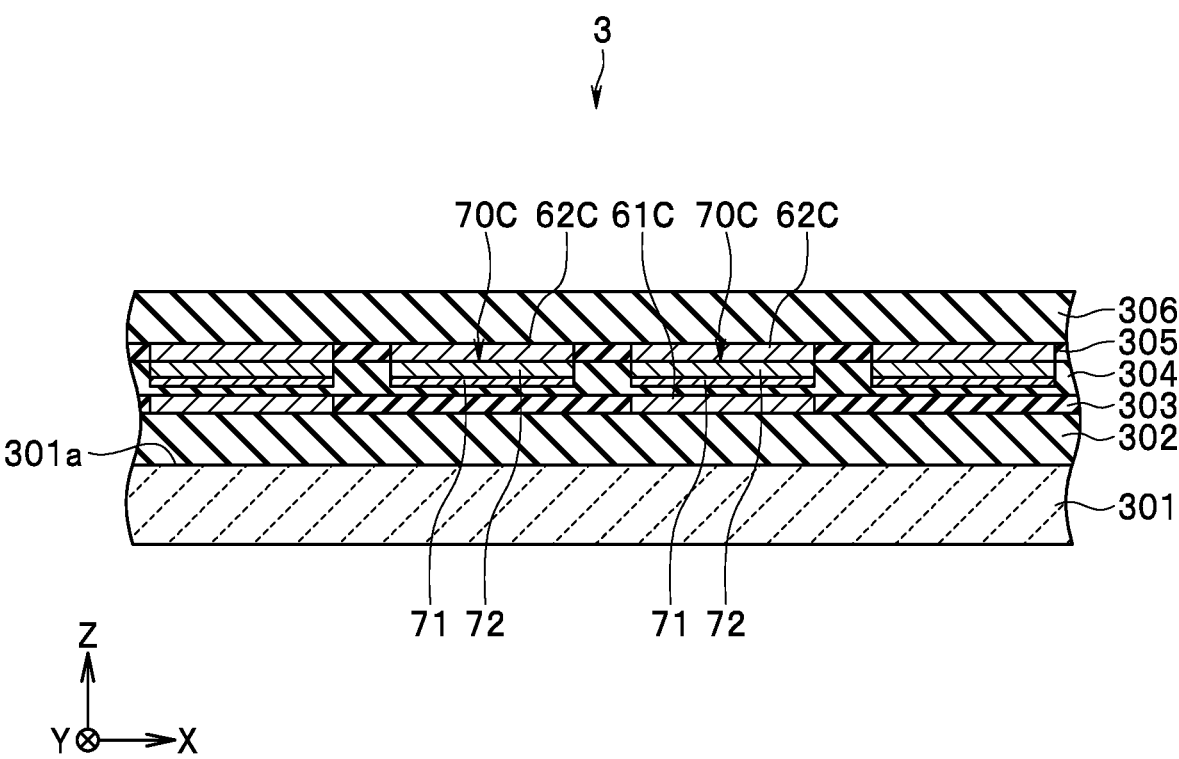
FIG. 15 is another sectional view showing a part of the second chip of the first example embodiment of the technology.

Next, a structure of the second chip 3 will be described with reference to FIGS. 12 to 15. FIG. 12 is a perspective view showing a part of the second chip 3. FIG. 13 is a plan view showing a part of the second chip 3. FIGS. 14 and 15 are sectional views showing a part of the second chip 3. FIG. 14 shows a part of a cross section at the position indicated by the line 14-14 in FIG. 13. FIG. 15 shows a part of a cross section at the position indicated by the line 15-15 in FIG. 13.

The second chip 3 includes a substrate 301 having a top surface 301a, insulating layers 302, 303, 304, 305, and 306, a plurality of lower electrodes 61C, a plurality of upper electrodes 62C, and a plurality of third magnetic field generators 70C. The top surface 301a of the substrate 301 is parallel to the XY plane. The Z direction is a direction perpendicular to the top surface 301a of the substrate 301.

The insulating layer 302 is disposed on the substrate 301. The plurality of lower electrodes 61C are disposed on the insulating layer 302. The insulating layer 303 is disposed around the plurality of lower electrodes 61C on the insulating layer 302. The plurality of third MR elements 50C are disposed on the plurality of lower electrodes 61C. The insulating layer 304 is disposed around the plurality of third MR elements 50C on the plurality of lower electrodes 61C and the insulating layer 303. The plurality of upper electrodes 62C are disposed on the plurality of third MR elements 50C and the insulating layer 304. The insulating layer 305 is disposed around the plurality of upper electrodes 62C on the insulating layer 304. The insulating layer 306 is disposed on the plurality of upper electrodes 62C and the insulating layer 305.

The plurality of third magnetic field generators 70C are embedded in the insulating layer 304. Each of the third magnetic field generators 70C is located at predetermined distances from the third MR elements 50C and the lower electrodes 61C. The insulating layer 304 includes insulating films interposed respectively between each of the plurality of third magnetic field generators 70C and each of the plurality of second MR elements 50C and between each of the plurality of third magnetic field generators 70C and each of the plurality of lower electrodes 61C. The top surfaces of some of the plurality of third magnetic field generators 70C may be in contact with the bottom surfaces of the plurality of upper electrodes 62C.

The second chip 3 includes a support member that supports the plurality of third MR elements 50C. In particular, in the present example embodiment, the support member includes the insulating layer 302. The top surface of the insulating layer 302 includes a flat surface.

The top surface 301a of the substrate 301 is parallel to the XY plane, and the top surface of each of the plurality of lower electrodes 61C is also parallel to the XY plane.

Moreover, the reference plane 4a is parallel to the XY plane. The plurality of third MR elements 50C can thus be said to be disposed on a plane parallel to the reference plane 4a.

As shown in FIGS. 12 and 13, the plurality of third magnetic field generators 70C are arranged several in rows in both the X and Y directions. Each of the plurality of third MR elements 50C is located between two third magnetic field generators 70C adjoining in the direction parallel to the Y direction.

The plurality of third MR elements 50C are connected in series by the plurality of lower electrodes 61C and the plurality of upper electrodes 62C. The foregoing description of the method for connecting the plurality of first MR elements 50A also applies to a method for connecting the plurality of third MR elements 50C. If the MR elements 50 in FIG. 16 are the third MR elements 50C, the lower electrodes 61, the upper electrodes 62, and the magnetic field generators 70 in FIG. 16 correspond to the lower electrodes 61C, the upper electrodes 62C, and the third magnetic field generators 70C, respectively.

If the MR elements 50 shown in FIG. 16 are the third MR elements 50C, the first direction D1 is the Y direction or the −Y direction. The second direction D2 is the X direction or the −X direction. The third direction D3 is the Z direction.

Next, the MR elements 50 will be described in more detail with reference to FIG. 16. In FIG. 16, the reference numeral 52 denotes the magnetization pinned layer, the reference numeral 53 the gap layer, and the reference numeral 54 the free layer. The MR element 50 further includes an antiferromagnetic layer 51. The antiferromagnetic layer 51, the magnetization pinned layer 52, the gap layer 53, and the free layer 54 are stacked in this order from the lower electrode 61 to the upper electrode 62. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

It should be appreciated that the layers 51 to 54 of each MR element 50 may be stacked in the reverse order to that shown in FIG. 16.

In the first MR element 50A, the antiferromagnetic layer 51, the magnetization pinned layer 52, the gap layer 53, and the free layer 54 are stacked in a direction intersecting the first inclined surface 203a (see FIGS. 8 and 10). This direction may be a direction perpendicular to the first inclined surface 203a. At least the magnetization pinned layer 52 and the free layer 54 of the first MR element 50A correspond to the "plurality of magnetic layers" of the technology.

In the second MR element 50B, the antiferromagnetic layer 51, the magnetization pinned layer 52, the gap layer 53, and the free layer 54 are stacked in a direction intersecting the second inclined surface 203b (see FIGS. 8 and 10). This direction may be a direction perpendicular to the second inclined surface 203b. At least the magnetization pinned layer 52 and the free layer 54 of the second MR element 50B correspond to the "plurality of magnetic layers" of the technology.

In the third MR element 50C, the antiferromagnetic layer 51, the magnetization pinned layer 52, the gap layer 53, and the free layer 54 are stacked in a direction intersecting the top surface of the insulating layer 302 (see FIGS. 12 and 14). This direction may be a direction perpendicular to the top surface of the insulating layer 302, i.e., the Z direction.

Next, the magnetic field generators 70 will be described in more detail with reference to FIG. 16. Each magnetic field generator 70 includes the ferromagnetic material section 72 and the antiferromagnetic material section 71 that is in contact with the ferromagnetic material section 72 and is in exchange coupling with the ferromagnetic material section 72.

The ferromagnetic material section 72 has its overall magnetization. The overall magnetization of the ferromagnetic material section 72 refers to the volume average of the vector sum of magnetic moments in units of atoms, crystal lattices, or the like in the entire ferromagnetic material section 72. Hereinafter, the overall magnetization of the ferromagnetic material section 72 will simply be referred to as the magnetization of the ferromagnetic material section 72.

In the magnetic field generator 70, the direction of the magnetization of the ferromagnetic material section 72 is defined by exchange coupling between the antiferromagnetic material section 71 and the ferromagnetic material section 72. The magnetic field generator 70 has high immunity to disturbance magnetic fields.

The ferromagnetic material section 72 may be constituted by a single ferromagnetic layer or may include a plurality of constituent layers stacked on each other. The ferromagnetic material section 72 (the ferromagnetic layer) is formed of a ferromagnetic material containing one or more elements selected from Co, Fe, and Ni. Examples of such a ferromagnetic material include CoFe, CoFeB, and CoNiFe. The antiferromagnetic material section 71 is formed of an antiferromagnetic material such as IrMn or PtMn.

The dimension of the magnetic field generator 70 in a direction parallel to the second direction D2 is greater than that of the MR element 50 in the direction parallel to the second direction D2. The dimension of the magnetic field generator 70 in the direction parallel to the second direction D2 is also greater than that of the magnetic field generator 70 in the direction parallel to the first direction D1.

When seen in the first direction D1, at least a part of the free layer 54 of the MR element 50 overlaps at least a part of the ferromagnetic material section 72 of the magnetic field generator 70. In the example shown in FIG. 16, the entire free layer 54 overlaps a part of the ferromagnetic material section 72 when seen in the first direction D1.

In the first magnetic field generator 70A, the antiferromagnetic material section 71 and the ferromagnetic material section 72 are stacked in a direction intersecting the first inclined surface 203a (see FIGS. 8 and 11). This direction may be a direction perpendicular to the first inclined surface 203a. The antiferromagnetic material section 71 and the ferromagnetic material section 72 each have a bottom surface opposed to the first inclined surface 203a and inclined relative to the top surface 201a of the substrate 201, i.e., the XY plane. Such a bottom surface can be implemented by forming each of the antiferromagnetic material section 71 and the ferromagnetic material section 72 in such a thickness that the shape of the first inclined surface 203a appears.

In the second magnetic field generator 70B, the antiferromagnetic material section 71 and the ferromagnetic material section 72 are stacked in a direction intersecting the second inclined surface 203b (see FIGS. 8 and 11). This direction may be a direction perpendicular to the second inclined surface 203b. The antiferromagnetic material section 71 and the ferromagnetic material section 72 each have a bottom surface opposed to the second inclined surface 203b and inclined relative to the top surface 201a of the substrate 201, i.e., the XY plane. Such a bottom surface can be implemented by forming each of the antiferromagnetic material section 71 and the ferromagnetic material section 72 in such a thickness that the shape of the second inclined surface 203b appears.

In the third magnetic field generator 70C, the antiferromagnetic material section 71 and the ferromagnetic material section 72 are stacked in a direction intersecting the top surface of the insulating layer 302 (see FIGS. 12 and 15). This direction may be a direction perpendicular to the top surface of the insulating layer 302, i.e., the Z direction.

Figure 17:
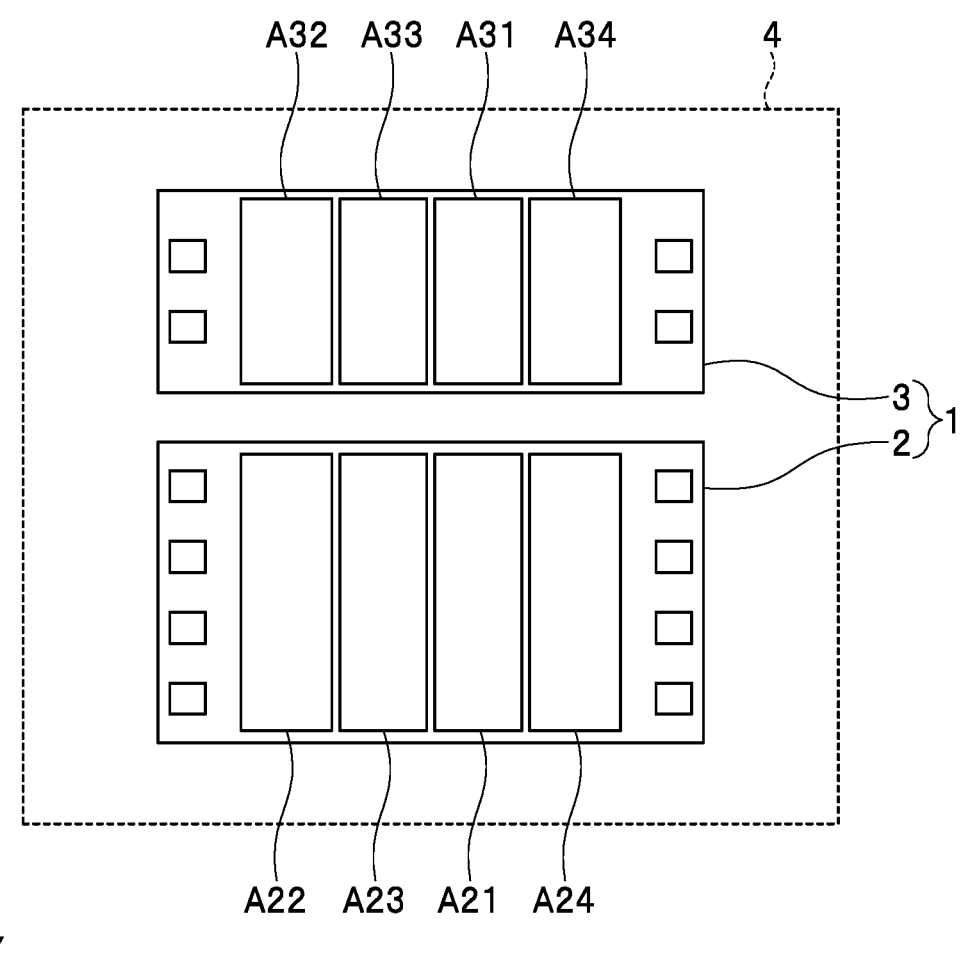
FIG. 17 is an explanatory diagram for describing a first example of layout of a plurality of magnetoresistive elements and a plurality of magnetic field generators of the first example embodiment of the technology.

Next, the layout of the plurality of MR elements 50 and the plurality of magnetic field generators 70 will be described. A first example of the layout of the plurality of MR elements 50 and the plurality of magnetic field generators 70 will initially be described with reference to FIG. 17. The first chip 2 includes a first element layout area for the plurality of first MR elements 50A, the plurality of second MR elements 50B, the plurality of first magnetic field generators 70A, and the plurality of second magnetic field generators 70B to be laid out in. Since the first chip 2 is a component of the magnetic sensor 1, the magnetic sensor 1 can be said to include the first element layout area. In the example embodiment, the first element layout area and a second element layout area and a plurality of areas to be described below are defined as planar areas parallel to the XY plane. When seen in the Z direction, the plurality of first MR elements 50A, the plurality of second MR elements 50B, the plurality of first magnetic field generators 70A, and the plurality of second magnetic field generators 70B overlap the first element layout area. In the present example embodiment, it is assumed for convenience sake that the first element layout area is present on the top surface of the insulating layer 203.

The first element layout area includes a first area A21, a second area A22, a third area A23, and a fourth area A24. The first area A21 is an area corresponding to the first resistor sections R11 and R21. The second area A22 is an area corresponding to the second resistor sections R12 and R22. The third area A23 is an area corresponding to the third resistor sections R13 and R23. The fourth area A24 is an area corresponding to the fourth resistor sections R14 and R24.

The plurality of first MR elements 50A are disposed dividedly in the first to fourth areas A21 to A24. The first MR elements 50A constituting the first resistor section R11 are disposed in the first area A21. The first MR elements 50A constituting the second resistor section R12 are disposed in the second area A22. The first MR elements 50A constituting the third resistor section R13 are disposed in the third area A23. The first MR elements 50A constituting the fourth resistor section R14 are disposed in the fourth area A24.

The plurality of first magnetic field generators 70A are disposed dividedly in the first to fourth areas A21 to A24. Each of a plurality of first magnetic field generators 70A disposed in two of the first to fourth areas A21 to A24 and each of a plurality of first magnetic field generators 70A disposed in the other two have magnetizations in respective different directions.

The direction of the arrows denoted by the symbol M11 shown in FIG. 5 will be referred to as the direction M11. The directions of the arrows denoted by symbols other than M11 will be referred to in a manner similar to the direction M11.

The magnetization of the ferromagnetic material section 72 of each of the plurality of first magnetic field generators 70A disposed in the first area A21 includes a component in the direction M11. The magnetization of the ferromagnetic material section 72 of each of the plurality of first magnetic field generators 70A disposed in the second area A22 includes a component in the direction M12 (see FIG. 5). The magnetization of the ferromagnetic material section 72 of each of the plurality of first magnetic field generators 70A disposed in the third area A23 includes a component in the direction M13 (see FIG. 5). The magnetization of the ferromagnetic material section 72 of each of the plurality of first magnetic generators 70A disposed in the fourth area A24 includes a component in the direction M14 (see FIG. 5).

As shown in FIG. 5, the directions M11 and M12 are the same as the X direction. The magnetization of the ferromagnetic material section 72 of each of the plurality of first magnetic field generators 70A disposed in the first area A21 and the plurality of first magnetic field generators 70A disposed in the second area A22 thus includes a component in the X direction. This magnetization may include the component in the X direction as its main component. In such a case, the direction of this magnetization is the X direction or close to the X direction.

As shown in FIG. 5, the directions M13 and M14 are the same as the –X direction. The magnetization of the ferromagnetic material section 72 of each of the plurality of first magnetic field generators 70A disposed in the third area A23 and the plurality of first magnetic field generators 70A disposed in the fourth area A24 thus includes a component in the –X direction. This magnetization may include the component in the –X direction as its main component. In such a case, the direction of this magnetization is the –X direction or close to the –X direction.

The foregoing description of the layout of the plurality of first MR elements 50A and the layout and magnetization directions of the plurality of first magnetic field generators 70A also applies to the plurality of second MR elements 50B and the plurality of second magnetic field generators 70B. A description of the layout of the plurality of second MR elements 50B is given by replacing the first MR elements 50A, the first resistor sections R11, the second resistor sections R12, the third resistor sections R13, and the fourth resistor sections R14 in the foregoing description of the layout of the plurality of first MR elements 50A with the second MR elements 50B, the first resistor sections R21, the second resistor sections R22, the third resistor sections R23, and the fourth resistor sections R24, respectively. A description of the layout and magnetization directions of the plurality of second magnetic field generators 70B is given by replacing the first magnetic field generators 70A and directions M11, M12, M13, and M14 in the foregoing description of the layout and magnetization directions of the plurality of first magnetic field generators 70A with the second magnetic field generators 70B and directions M21, M22, M23, and M24 (see FIG. 6), respectively.

In the first example, the first to fourth areas A21 to A24 are arranged in order of the areas A22, A23, A21, and A24 from the edge of the first chip 2 on the –X direction side to the edge of the first chip 2 on the X direction side. The plurality of first MR elements 50A, the plurality of second MR elements 50B, the plurality of first magnetic field generators 70A, and the plurality of second magnetic field generators 70B are all arranged by the same rule as with the first to fourth areas A21 to A24 depending on the foregoing features.

The second chip 3 includes a second element layout area for the plurality of third MR elements 50C and the plurality of third magnetic field generators 70C to be laid out in. Since the second chip 3 is a component of the magnetic sensor 1, the magnetic sensor 1 can be said to include the second element layout area. When seen in the Z direction, the plurality of third MR elements 50C and the plurality of third magnetic field generators 70C overlap the second element layout area. In the present example embodiment, it is assumed for convenience sake that the second element layout area is present on the top surface of the insulating layer 302.

The second element layout area includes a first area A31, a second area A32, a third area A33, and a fourth area A34. The first area A31 is an area corresponding to the first resistor section R31. The second area A32 is an area corresponding to the second resistor section R32. The third area A33 is an area corresponding to the third resistor section R33. The fourth area A34 is an area corresponding to the fourth resistor section R34.

The plurality of third MR elements 50C are disposed dividedly in the first to fourth areas A31 to A34. The third MR elements 50C constituting the first resistor section R31 are disposed in the first area A31. The third MR elements 50C constituting the second resistor section R32 are disposed in the second area A32. The third MR elements 50C constituting the third resistor section R33 are disposed in the third area A33. The third MR elements 50C constituting the fourth resistor section R34 are disposed in the fourth area A34.

The plurality of third magnetic field generators 70C are disposed dividedly in the first to fourth areas A31 to A34. Each of a plurality of third magnetic field generators 70C disposed in two of the first to fourth areas A31 to A34 and each of a plurality of third magnetic field generators 70C disposed in the other two have magnetizations in respective different directions.

The magnetization of the ferromagnetic material section 72 of each of the plurality of third magnetic field generators 70C disposed in the first area A31 includes a component in the direction M31 (see FIG. 7). The magnetization of the ferromagnetic material section 72 of each of the plurality of third magnetic field generators 70C disposed in the second area A32 includes a component in the direction M32 (see FIG. 7). The magnetization of the ferromagnetic material section 72 of each of the plurality of third magnetic field generators 70C disposed in the third area A33 includes a component in the direction M33 (see FIG. 7). The magnetization of the ferromagnetic material section 72 of each of the plurality of third magnetic field generators 70C disposed in the fourth area A34 includes a component in the direction M34 (see FIG. 7).

As shown in FIG. 7, the directions M31 and M32 are the same as the Y direction. The magnetization of the ferromagnetic material section 72 of each of the plurality of third magnetic field generators 70C disposed in the first area A31 and the plurality of third magnetic field generators 70C disposed in the second area A32 thus includes a component in the Y direction. This magnetization may include the component in the Y direction as its main component. In such a case, the direction of this magnetization is the Y direction or close to the Y direction.

As shown in FIG. 7, the directions M33 and M34 are the same as the −Y direction. The magnetization of the ferromagnetic material section 72 of each of the plurality of third magnetic field generators 70C disposed in the third area A33 and the plurality of third magnetic field generators 70C disposed in the fourth area A34 includes a component in the −Y direction. This magnetization may include the component in the −Y direction as its main component. In such a case, the direction of this magnetization is the −Y direction or close to the −Y direction.

In the first example, the first to fourth areas A31 to A34 are arranged in order of the areas A32, A33, A31, and A34 from the edge of the second chip 3 on the −X direction side to the edge of the second chip 3 on the X direction side. The plurality of third MR elements 50C and the plurality of third magnetic field generators 70C are both arranged by the same rule as with the first to fourth areas A31 to A34 depending on the foregoing features.

Figure 18:
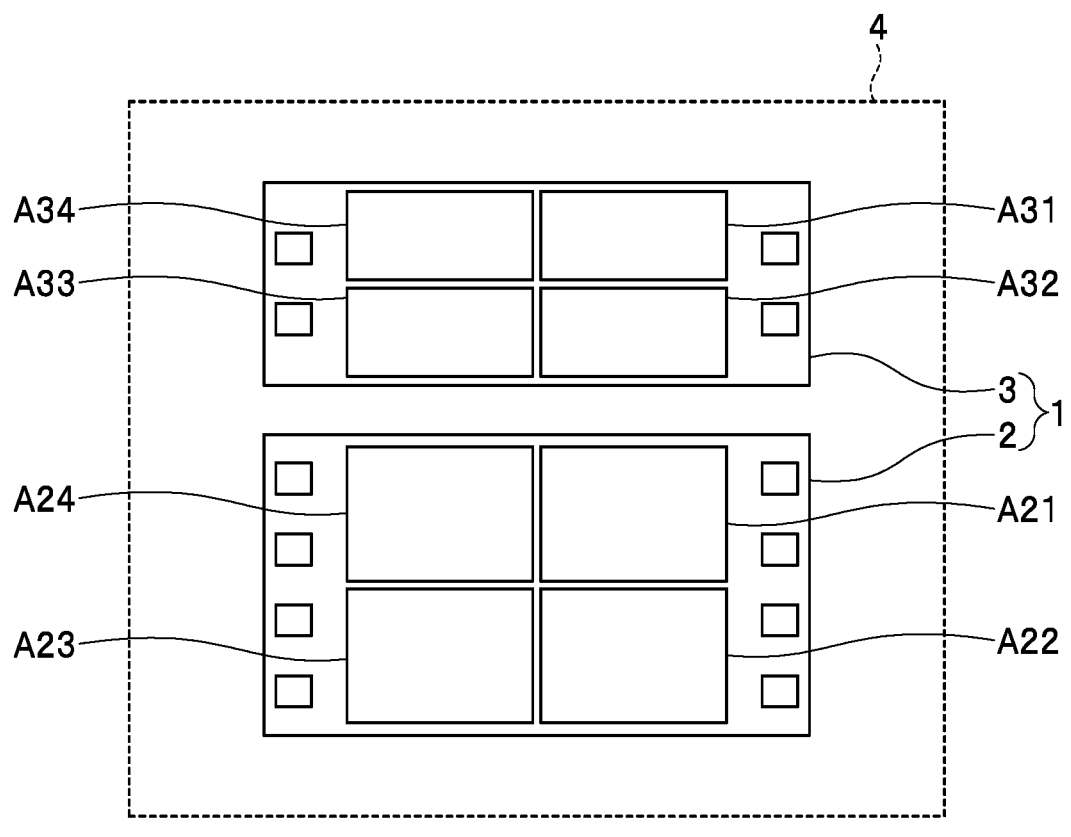
FIG. 18 is an explanatory diagram for describing a second example of the layout of the plurality of magnetoresistive elements and the plurality of magnetic field generators of the first example embodiment of the technology.

Next, a second example of the layout of the plurality of MR elements 50 and the plurality of magnetic field generators 70 will be described with reference to FIG. 18. In the second example, the first and second areas A21 and A22 are arranged in this order in the −Y direction. The third and fourth areas A23 and A24 are located forward of the second and first areas A22 and A21 in the −X direction, respectively.

In the second example, the first and second areas A31 and A32 are arranged in this order in the −Y direction. The third and fourth areas A33 and A34 are located forward of the second and first areas A32 and A31 in the −X direction, respectively.

Next, a manufacturing method for the magnetic sensor device 100 according to the example embodiment will be briefly described. The manufacturing method for the magnetic sensor device 100 includes a step of forming the first chip 2, a step of forming the second chip 3, and a step of mounting the first and second chips 2 and 3 on the support 4.

The step of forming the first chip 2 and the step of forming the second chip 3 each include a step of forming a plurality of MR elements 50 and a step of forming a plurality of magnetic field generators 70.

In the step of forming the plurality of MR elements 50, a plurality of initial MR elements to later become the plurality of MR elements 50 are initially formed. Each of the plurality of initial MR elements includes an initial magnetization pinned layer to later become the magnetization pinned layer 52, the free layer 54, the gap layer 53, and the antiferromagnetic layer 51.

Next, the magnetization directions of the initial magnetization pinned layers are fixed to predetermined directions using laser light and external magnetic fields including the components in the foregoing predetermined directions. For example, a plurality of initial MR elements to later become the plurality of first MR elements 50A constituting the first and third resistor sections R11 and R13 of the first detection circuit 10 are irradiated with laser light while an external magnetic field in the Y direction is applied thereto. The external magnetic field in the Y direction can be divided into a component in the U direction and a component in a direction orthogonal to the U direction. When the irradiation with the laser light is completed, the magnetization directions of the initial magnetization pinned layers are fixed to the U direction. This makes the initial magnetization pinned layers into the magnetization pinned layers 52, and the initial MR elements into the first MR elements 50A.

In the plurality of initial MR elements to later become the plurality of first MR elements 50A constituting the second and fourth resistor sections R12 and R14 of the first detection circuit 10, the magnetization direction of the initial magnetization pinned layer of each of the plurality of initial MR elements can be fixed to the −U direction by using an external magnetic field in the −Y direction. The plurality of first MR elements 50A are thereby formed. The plurality of second MR elements 50B and the plurality of third MR elements 50C are also formed using a method similar to that used to form the plurality of first MR elements 50A.

In the step of forming the plurality of magnetic field generators 70, a plurality of initial magnetic field generators to later become the plurality of magnetic field generators 70 are initially formed. Each of the plurality of initial magnetic field generators includes an initial ferromagnetic material section to later become a ferromagnetic material section 72, and an antiferromagnetic material section 71.

Next, the magnetization directions of the initial ferromagnetic material sections are fixed to a predetermined direction using laser light and an external magnetic field including a component in the foregoing predetermined direction. For example, the plurality of initial magnetic field generators to become the plurality of first magnetic field generators 70A and the plurality of second magnetic field generators 70B disposed in the first and second areas A21 and A22 of the first chip 2 are irradiated with the laser light while an external magnetic field in the X direction is applied thereto. When the irradiation of the laser light is completed, the magnetization directions of the initial ferromagnetic material sections are fixed to the X direction. This makes the initial ferromagnetic material sections into the ferromagnetic material sections 72, and the initial magnetic field generators into the first or second magnetic field generators 70A or 70B. In the plurality of initial magnetic field generators to become the plurality of first magnetic field generators 70A and the plurality of second magnetic field generators 70B disposed in the third and fourth areas A23 and A24 of the first chip 2, the magnetization direction of the initial ferromagnetic material section of each of the plurality of initial magnetic field generators can be fixed to the –X direction by using an external magnetic field in the –X direction. The plurality of first magnetic field generators 70A and the plurality of second magnetic field generators 70B are thereby formed. The plurality of third magnetic field generators 70C are formed using a method similar to that used to form the plurality of first magnetic field generators 70A and the plurality of second magnetic field generators 70B.

As can be seen from the foregoing description of the manufacturing method for the magnetic sensor device 100, in the example embodiment, the magnetization directions of the magnetization pinned layers 52 of the first MR elements 50A, the magnetization directions of the magnetization pinned layers 52 of the second MR elements 50B, and the magnetization directions of the magnetization pinned layers 52 of the third MR elements 50C are each fixed by using laser light and an external magnetic field. Moreover, in the example embodiment, the magnetization directions of the ferromagnetic material sections 72 of the first magnetic field generators 70A, the magnetization directions of the ferromagnetic material sections 72 of the second magnetic field generators 70B, and the magnetization directions of the ferromagnetic material sections 72 of the third magnetic field generators 70C are each fixed by using laser light and an external magnetic field.

Here, the intensity of the laser light used to fix the magnetization directions of the ferromagnetic material sections 72 will be referred to as the intensity of the laser light for the ferromagnetic material sections 72. The intensity of the laser light for the ferromagnetic material sections 72 may be lower than the intensity of the laser light used to fix the magnetization directions of the magnetization pinned layers 52. The intensity of the laser light for the ferromagnetic material sections 72 is desirably such that a change in a magnetoresistive change ratio (hereinafter, referred to as an MR ratio) that is the ratio of a magnetoresistive change to the resistance of the MR element 50 is reduced. For example, the intensity of the laser light for the ferromagnetic material sections 72 is desirably such that a change in the MR ratio is reduced to within 10%, preferably within 5% or within 3%. Note that the irradiation with the laser light for the ferromagnetic material sections 72 can increase or decrease the MR ratio.

Next, the operation and effects of the magnetic sensor 1 according to the example embodiment will be described. In the example embodiment, the ferromagnetic material section 72 and the antiferromagnetic material section 71 of each of the plurality of first magnetic field generators 70A are stacked in a direction intersecting the first inclined surface 203a. Suppose now that the ferromagnetic material section 72 and the antiferromagnetic material section 71 of the first magnetic field generator 70A are stacked in a direction parallel to the Z direction. In such a case, if at least either one of the first MR element 50A and the first magnetic field generator 70A deviates from the designed position due to manufacturing variations, the relative positional relationship between the free layer 54 of the first MR element 50A and the ferromagnetic material section 72 of the first magnetic field generator 70A changes. This leads to a problem that the strength and direction of the magnetic field applied to the first MR element 50A by the first magnetic field generator 70A changes.

By contrast, in the example embodiment, the ferromagnetic material section 72 and the antiferromagnetic material section 71 of each of the plurality of first magnetic field generators 70A are stacked in a direction intersecting the first inclined surface 203a. According to the example embodiment, the relative positional relationship between the free layer 54 of the first MR element 50A and the ferromagnetic material section 72 of the first magnetic field generator 70A can thereby be prevented from changing greatly if at least either one of the first MR element 50A and the first magnetic field generator 70A deviates from the designed position due to manufacturing variations. According to the example embodiment, variations in the magnetic fields applied to the first MR elements 50A by the first magnetic field generators 70A can thus be reduced.

The foregoing description of the first MR elements 50A and the first magnetic field generators 70A also applies to the second MR elements 50B and the second magnetic field generators 70B. According to the example embodiment, variations in the magnetic fields applied to the second MR elements 50B by the second magnetic field generators 70B can be reduced.

In the example embodiment, the free layers 54 are located forward of the magnetization pinned layers 52 in the third direction D3 (see FIG. 16). The ferromagnetic material sections 72 are located forward of the antiferromagnetic material sections 71 in the third direction D3 (see FIG. 16). According to the example embodiment, the free layers 54 can thus be located close to the ferromagnetic material sections 72 as compared to a case where the magnetization pinned layers 52 are located forward of the free layers 54 in the third direction D3. According to the example embodiment, the strength of the magnetic fields applied to the free layers 54 by the magnetic field generators 70 can thus be increased.

Second Example Embodiment

Figure 19:
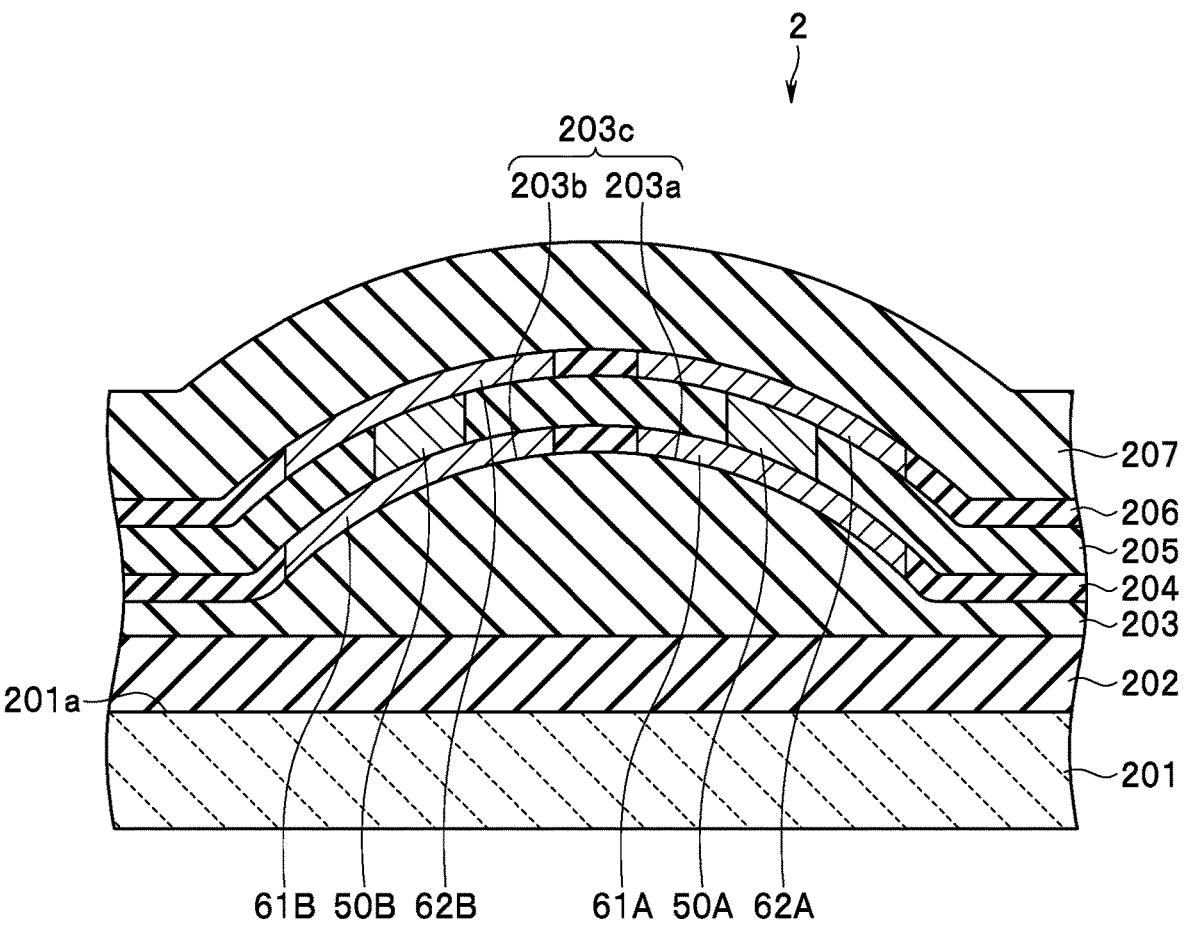
FIG. 19 is a sectional view showing a part of a first chip of a second example embodiment of the technology.
Figure 19:
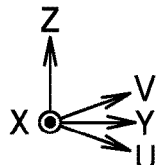

A second example embodiment of the technology will now be described with reference to FIGS. 19 and 20. FIGS.

19 and 20 are sectional views showing a part of the first chip 2 of the present example embodiment.

In the present example embodiment, the protruding surface 203c of the insulating layer 203 is a semi-cylindrical curved surface formed by moving the curved shape (arch shape) along the direction parallel to the X direction. Thus, in the present example embodiment, the first inclined surface 203a is a curved surface. The first MR elements 50A are curved along the curved surface (the first inclined surface 203a). Even in such a case, the magnetization direction of the magnetization pinned layer 52 of each first MR element 50A is defined as a straight direction for convenience sake. Similarly, in the present example embodiment, the second inclined surface 203b is a curved surface. The second MR elements 50B are curved along the curved surface (the second inclined surface 203b). Even in such a case, the magnetization direction of the magnetization pinned layer 52 of each second MR element 50B is defined as a straight direction for convenience sake.

The insulating layer 203 further includes a flat surface present around the plurality of protruding surfaces 203c. The plurality of protruding surfaces 203c protrude from the flat surface in the Z direction. The plurality of protruding surfaces 203c are disposed with predetermined gaps therebetween so that a flat surface is formed between two adjoining protruding surfaces 203c.

Figure 20:
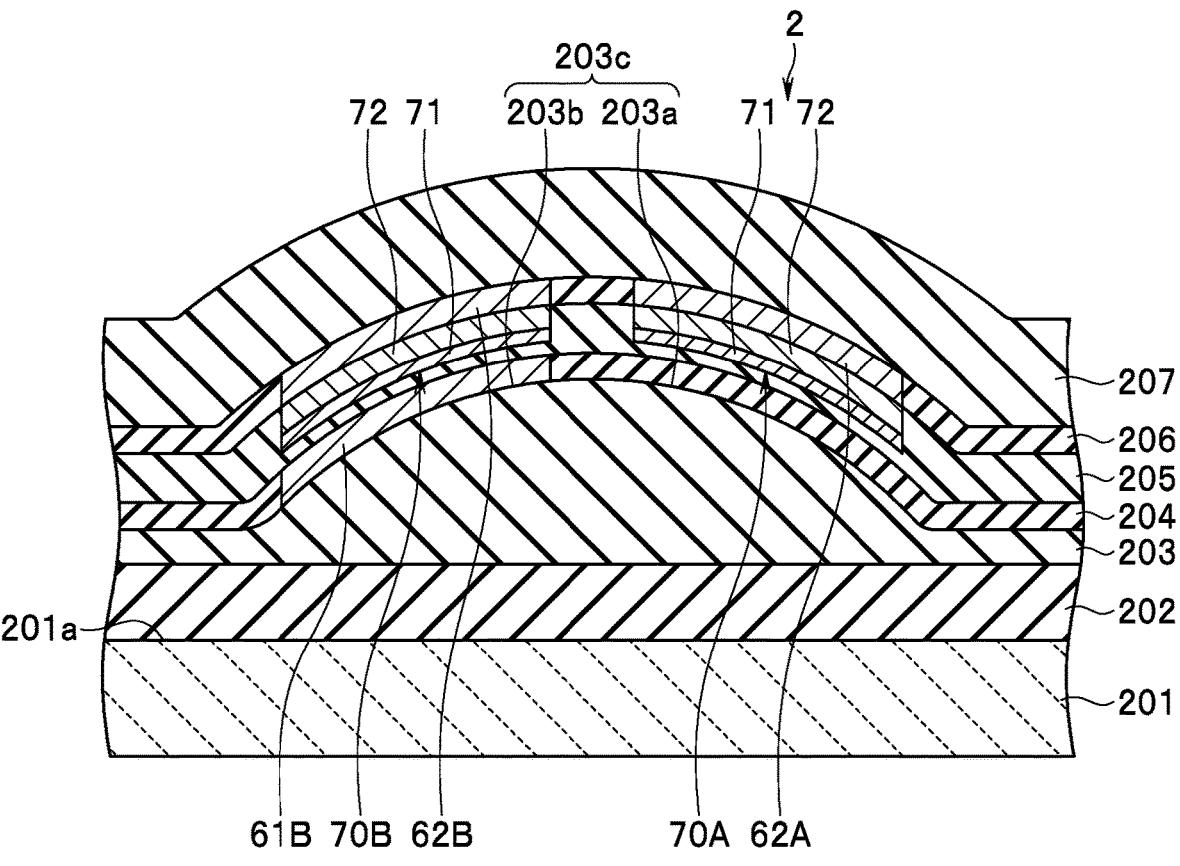
FIG. 20 is another sectional view showing a part of the first chip of the second example embodiment of the technology.
Figure 20:
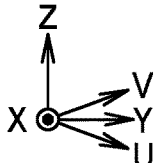

As shown in FIG. 20, the antiferromagnetic material section 71 and the ferromagnetic material section 72 of the first magnetic field generator 70A are stacked in a direction intersecting the first inclined surface 203a. This direction may be a normal direction to the portion of the first inclined surface 203a lying under the first magnetic field generator 70A. The bottom surface of the first MR element 50A is shaped along the first inclined surface 203a, i.e., a curved surface. The bottom surface of the first magnetic field generator 70A is shaped along the first inclined surface 203a (curved surface) and has substantially the same shape as that of the bottom surface of the first MR element 50A at least in part.

The antiferromagnetic material section 71 and the ferromagnetic material section 72 of the second magnetic field generator 70B are stacked in a direction intersecting the second inclined surface 203b. This direction may be a normal direction to the portion of the second inclined surface 203b lying under the second magnetic field generator 70B. The bottom surface of the second MR element 50B is shaped along the second inclined surface 203b, i.e., a curved surface. The bottom surface of the second magnetic field generator 70B is shaped along the second inclined surface 203b (curved surface) and has substantially the same shape as that of the bottom surface of the second MR element 50B at least in part.

The configuration, operation, and effects of the present example embodiment are otherwise the same as those of the first example embodiment.

Third Example Embodiment

Figure 21:
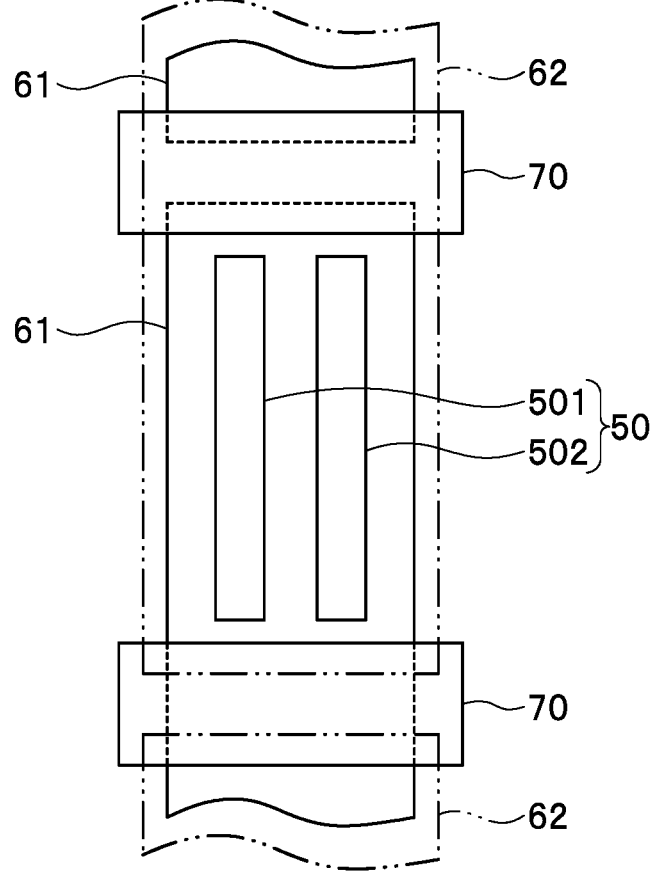
FIG. 21 is a plan view showing a magnetoresistive element and magnetic field generators of a third example embodiment of the technology.
Figure 21:
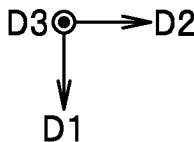

A third example embodiment of the technology will now be described with reference to FIG. 21. FIG. 21 is a plan view showing an MR element 50 and magnetic field generators 70 of the present example embodiment.

In the example embodiment, each of the plurality of MR elements 50 includes a plurality of layered films. Each of the plurality of layered films has the same configuration as that of the MR element 50 according to the first example embodiment. In the example shown in FIG. 21, the MR element 50 includes two layered films 501 and 502. The two layered films 501 and 502 are located between two magnetic field generators 70 adjoining in the first direction D1. The two layered films 501 and 502 are connected in parallel by a lower electrode 61 and an upper electrode 62.

Of the layered films included in each of the plurality of MR elements 50, one located at the end in the second direction D2 will be referred to as a first specific layered film, and one located at the end in the direction opposite to the second direction D2 will be referred to as a second specific layered film. The dimension of the magnetic field generator 70 in a direction parallel to the second direction D2 is greater than a distance from the end of the first specific layered film in the second direction D2 to the end of the second specific layered film in the direction opposite to the second direction D2.

If the MR element 50 shown in FIG. 21 is a first MR element 50A, the two layered films 501 and 502 are arranged in a direction intersecting the longitudinal direction (X direction) of the first inclined surface 203a (see FIGS. 8 and 10). If the MR element 50 shown in FIG. 21 is a second MR element 50B, the two layered films 501 and 502 are arranged in a direction intersecting the longitudinal direction (X direction) of the second inclined surface 203b (see FIGS. 8 and 10).

The configuration, operation, and effects of the present example embodiment are otherwise the same as those of the first or second example embodiments.

Fourth Example Embodiment

Figure 22:
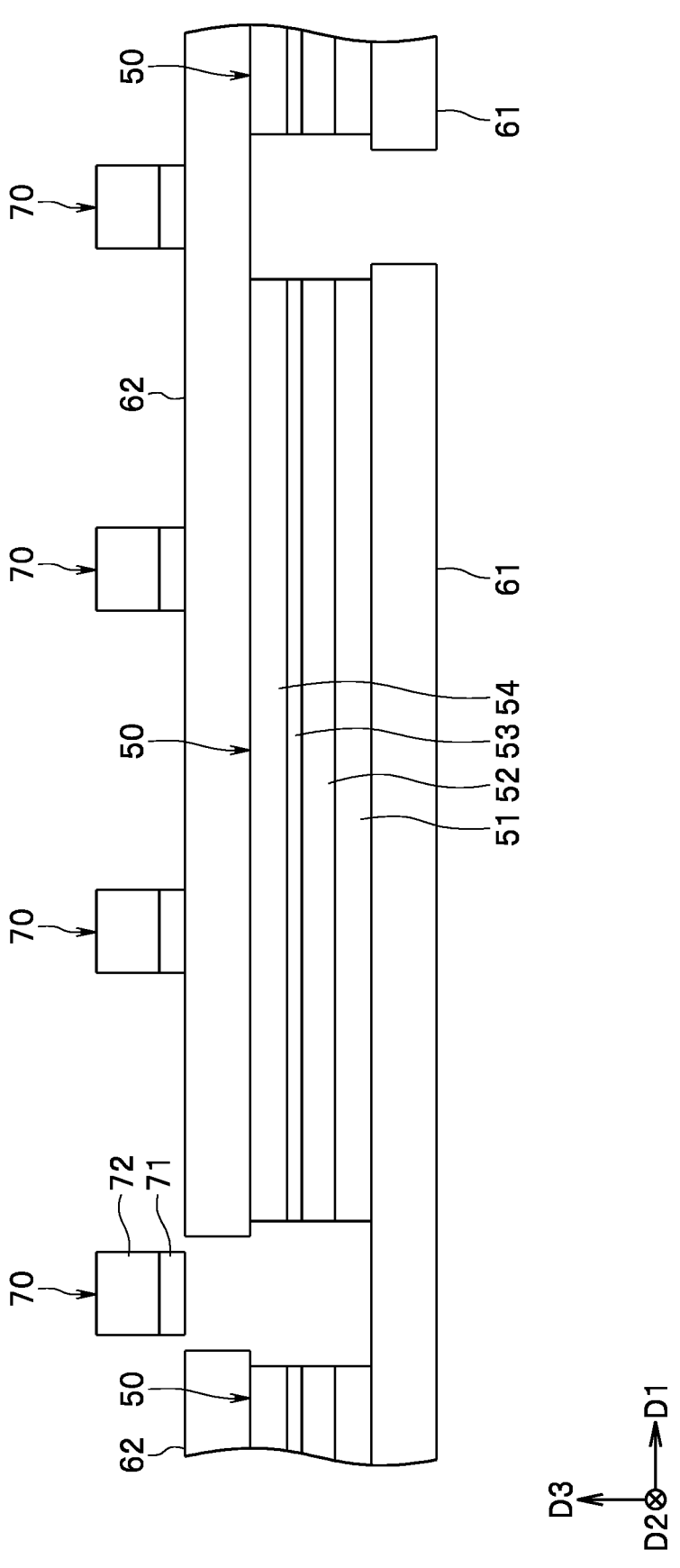
FIG. 22 is a side view showing magnetoresistive elements and magnetic field generators of a fourth example embodiment of the technology.
Figure 23:
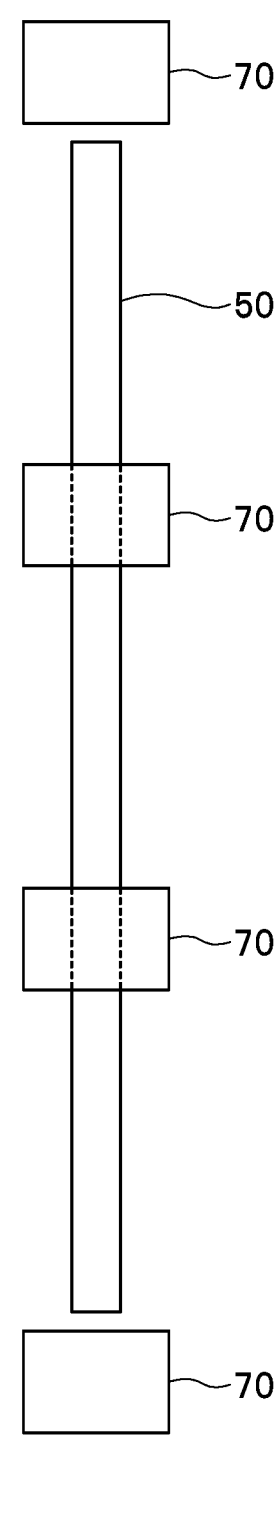
FIG. 23 is a plan view showing the magnetoresistive elements and the magnetic field generators of the fourth example embodiment of the technology.

A fourth example embodiment of the technology will now be described with reference to FIGS. 22 and 23. FIG. 22 is a side view showing MR elements 50 and magnetic field generators 70 of the present example embodiment. FIG. 23 is a plan view showing the MR elements 50 and the magnetic field generators 70 of the present example embodiment.

In the example embodiment, the plurality of magnetic field generators 70 are located above the MR elements 50. In the example shown in FIG. 22, some of the magnetic field generators 70 are in contact with the upper electrode 62. However, the plurality of magnetic field generators 70 do not need to be in contact with the upper electrode 62.

The MR element 50 is disposed between two specific magnetic field generators 70 located at positions away from each other in the first direction. At least one other magnetic field generator 70 is disposed between the two specific magnetic field generators 70. In the example shown in FIGS. 22 and 23, the number of the other magnetic field generators 70 is two. When seen from above, the other magnetic field generators 70 overlap the MR element 50. When seen from above, the two specific magnetic field generators 70 may or may not overlap the MR element 50.

The configuration, operation, and effects of the present example embodiment are otherwise the same as those of any of the first to third example embodiments. [Fifth Example Embodiment]

Figure 24:
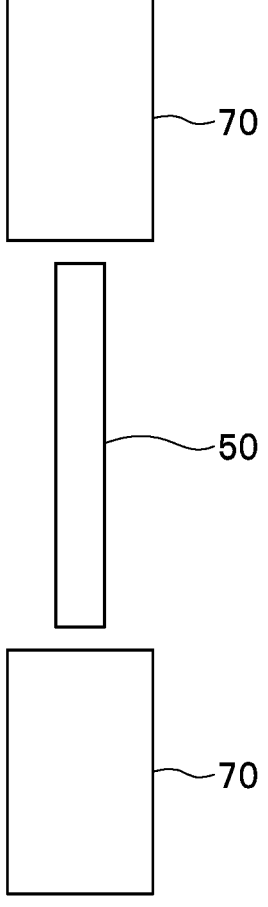
FIG. 24 is a plan view showing a magnetoresistive element and magnetic field generators of a fifth example embodiment of the technology.
Figure 24:
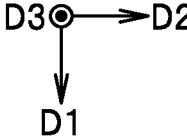

A fifth example embodiment of the technology will now be described with reference to FIG. 24. FIG. 24 is a plan view showing an MR element 50 and magnetic field generators 70 of the present example embodiment.

In the example embodiment, the dimension of the magnetic field generators 70 in the direction parallel to the second direction D2 is smaller than that of the magnetic field generators 70 in the direction parallel to the first direction D1. The configuration, operation, and effects of the present example embodiment are otherwise the same as those of any of the first to fourth example embodiments.

Sixth Example Embodiment

Figure 25:
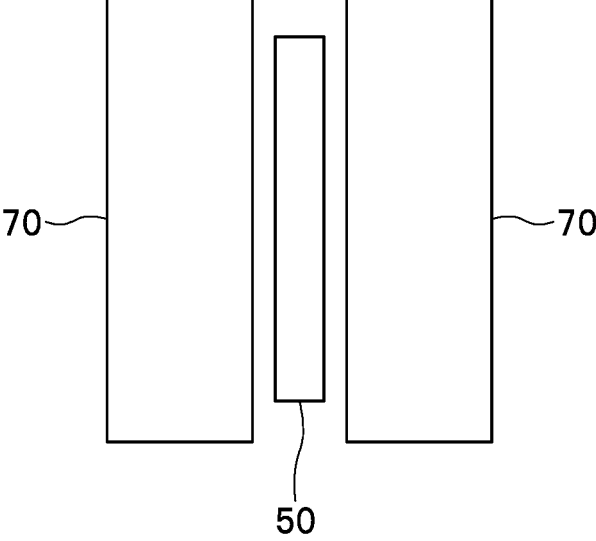
FIG. 25 is a plan view showing a magnetoresistive element and magnetic field generators of a sixth example embodiment of the technology.
Figure 25:
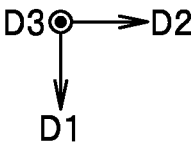

A sixth example embodiment of the technology will now be described with reference to FIG. 25. FIG. 25 is a plan view showing an MR element 50 and magnetic field generators 70 of the present example embodiment.

In the example embodiment, each of the plurality of MR elements 50 is disposed between two magnetic field generators 70 adjoining in the second direction D2. The dimension of the magnetic field generators 70 in the direction parallel to the first direction D1 is greater than that of the MR element 50 in the direction parallel to the first direction D1.

If the MR element 50 shown in FIG. 25 is a first MR element 50A and the magnetic field generators 70 shown in FIG. 25 are first magnetic field generators 70A, the two first magnetic field generators 70A on both sides of the first MR element 50A in the direction parallel to the second direction D2 are both located above a first inclined surface 203a (see FIGS. 8 and 11).

If the MR element 50 shown in FIG. 25 is a second MR element 50B and the magnetic field generators 70 shown in FIG. 25 are second magnetic field generators 70B, the two second magnetic field generators 70B on both sides of the second MR element 50B in the direction parallel to the second direction D2 are both located above a second inclined surface 203b (see FIGS. 8 and 11).

The configuration, operation, and effects of the present example embodiment are otherwise the same as those of the first or second example embodiments.

Seventh Example Embodiment

Figure 26:
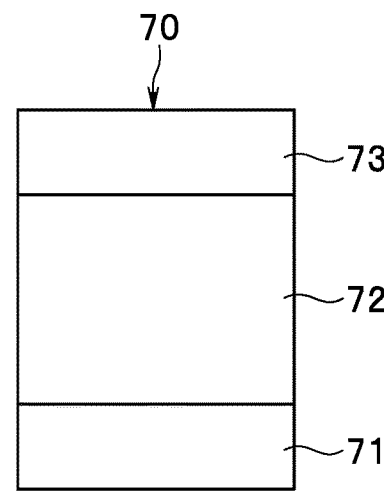
FIG. 26 is a side view showing a magnetic field generator of a seventh example embodiment of the technology.
Figure 26:
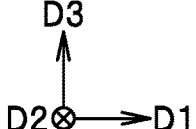

A seventh example embodiment of the technology will now be described with reference to FIG. 26. FIG. 26 is a side view showing a magnetic field generator 70 of the present example embodiment.

In the example embodiment, the magnetic field generator 70 includes an antiferromagnetic material section 73 that is in contact with the top surface of the ferromagnetic material section 72 and is in exchange coupling with the ferromagnetic material section 72, in addition to the antiferromagnetic material section 71 and the ferromagnetic material section 72. The antiferromagnetic material section 73 is formed of the same antiferromagnetic material as that of the antiferromagnetic material section 71, for example. The antiferromagnetic material sections 71 and 73 may be formed of different antiferromagnetic materials.

The configuration, operation and effects of the present example embodiment are otherwise the same as those of any of the first to sixth example embodiments.

Eighth Example Embodiment

Figure 27:
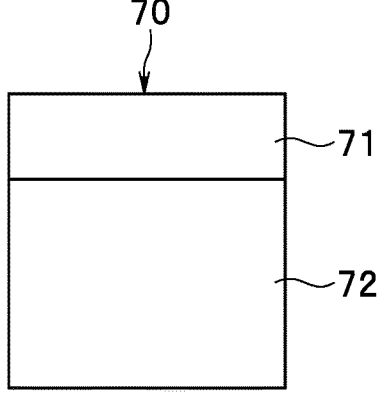
FIG. 27 is a side view showing a magnetic field generator of an eighth example embodiment of the technology.
Figure 27:
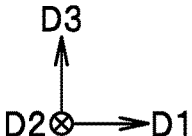

An eighth example embodiment of the technology will now be described with reference to FIG. 27. FIG. 27 is a side view showing a magnetic field generator 70 of the present example embodiment.

In the present example embodiment, the antiferromagnetic material section 71 is located forward of the ferromagnetic material section 72 in the third direction D3 contrary to the example shown in FIG. 16, etc., in the first example embodiment. The configuration, operation, and effects of the present example embodiment are otherwise the same as those of any of the first to sixth example embodiments.

Ninth Example Embodiment

Figure 28:
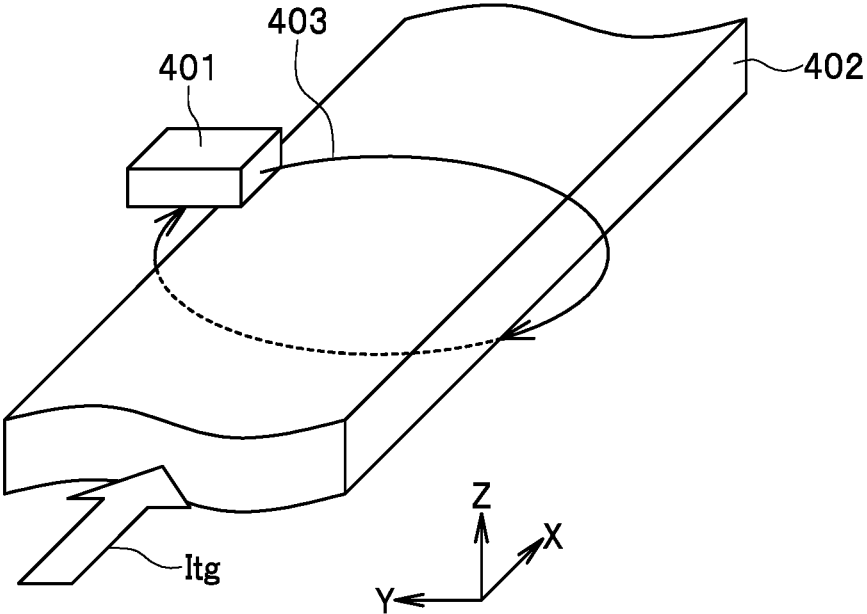
FIG. 28 is a perspective view showing a configuration of a current sensor system including a magnetic sensor according to a ninth example embodiment of the technology.

An ninth example embodiment of the technology will now be described with reference to FIG. 28. FIG. 28 is a perspective view showing a configuration of a current sensor system including a magnetic sensor according to the present example embodiment.

A magnetic sensor 401 according to the example embodiment is used as a current sensor for detecting the value of a current to be detected flowing through a conductor. FIG. 28 shows an example in which the conductor through which the current to be detected flows is a bus bar 402. The magnetic sensor 401 is disposed near the bus bar 402. Hereinafter, the current to be detected will be referred to as target current Itg. The target current Itg generates a magnetic field 403 around the bus bar 402. The magnetic sensor 401 is disposed at a position where the magnetic field 403 is applied. In the example embodiment, the target magnetic field is the magnetic field 403.

In the example embodiment, an X direction, a Y direction, and a Z direction will be defined as shown in FIG. 28. In FIG. 28, the direction in which the target current Itg flows is the X direction.

In particular, in the example embodiment, the magnetic sensor 401 is located at a position where a component of the magnetic field 403 in the Y direction and a component of the magnetic field 403 in the Z direction can be detected. The magnetic sensor 401 has the same configuration as that of the first chip 2 according to the first example embodiment.

Alternatively, the magnetic sensor 401 may have the same configuration as that of the second chip 3 according to the first example embodiment. In such a case, the magnetic sensor 401 is located at a position where a component of the magnetic field 403 in the X direction can be detected.

The configuration, operation, and effects of the present example embodiment are otherwise the same as those of any of the first to eighth example embodiments.

The technology is not limited to the foregoing example embodiments, and various modifications may be made thereto. For example, the magnetic sensor according to the technology may be a plurality of chips integrated into one.

As described above, a magnetic sensor of the technology includes a support member having at least one inclined surface inclined relative to a reference plane, at least one magnetic detection element disposed on the at least one inclined surface and configured to detect a target magnetic field, and at least one magnetic field generator disposed on the at least one inclined surface and configured to generate a magnetic field to be applied to the at least one magnetic detection element. The at least one magnetic field generator includes a ferromagnetic material section and an antiferromagnetic material section that is contact with the ferromagnetic material section and is in exchange coupling with the ferromagnetic material section. The ferromagnetic material section and the antiferromagnetic material section are stacked in a direction intersecting the at least one inclined surface.

In the magnetic sensor of the technology, the ferromagnetic material section and the antiferromagnetic material section may each have a bottom surface opposed to the at least one inclined surface and inclined relative to the reference plane.

In the magnetic sensor of the technology, the at least one magnetic detection element may include a plurality of magnetic layers stacked in the direction intersecting the at least one inclined surface.

In the magnetic sensor of the technology, the at least one magnetic detection element may have a first bottom surface shaped along the at least one inclined surface. The at least one magnetic field generator may have a second bottom surface shaped along the at least one inclined surface and having substantially the same shape as that of the first bottom surface at least in part.

In the magnetic sensor of the technology, the at least one inclined surface may have a shape long in a direction parallel to the reference plane when seen in a direction perpendicular to the reference plane. The at least one magnetic detection element may have a shape long along a longitudinal direction of the at least one inclined surface. The at least one magnetic detection element may include a specific magnetic detection element. The at least one magnetic field generator may include two specific magnetic field generators located on both sides of the specific magnetic detection element in a longitudinal direction of the specific magnetic detection element. The at least one magnetic field generator may include a plurality of magnetic field generators disposed along the longitudinal direction of the at least one inclined surface.

In the magnetic sensor of the technology, the at least one magnetic field generator may include a first magnetic field generator and a second magnetic field generator. The ferromagnetic material section of the first magnetic field generator may have a first magnetization. The ferromagnetic material section of the second magnetic field generator may have a second magnetization. The first magnetization may include a component in a first direction. The second magnetization may include a component in a second direction different from the first direction. The first magnetic field generator and the second magnetic field generator do not need to be disposed on the same plane.

In the magnetic sensor of the technology, the at least one magnetic detection element may include a first magnetic detection element and a second magnetic detection element. The first magnetic detection element and the second magnetic detection element do not need to be disposed on the same plane.

In the magnetic sensor of the technology, the at least one magnetic detection element may be at least one magnetoresistive element. The at least one magnetoresistive element may include a magnetization pinned layer having a magnetization whose direction is fixed, a free layer having a magnetization whose direction is variable depending on the target magnetic field, and a gap layer located between the magnetization pinned layer and the free layer. The magnetization pinned layer may be located between the at least one inclined surface and the gap layer.

In the magnetic sensor of the technology, the at least one inclined surface may include a specific inclined surface facing in a direction oblique to both the reference plane and the direction perpendicular to the reference plane. The specific inclined surface may have a shape long in a direction parallel to the reference plane when seen in the direction perpendicular to the reference plane. The at least one magnetic detection element may include two layered films disposed on the specific inclined surface and arranged in a direction intersecting a longitudinal direction of the specific inclined surface.

The magnetic sensor of the technology may further include a power supply port, a ground port, a first output port, a second output port, a first resistor section provided between the power supply port and the first output port, a second resistor section provided between the ground port and the first output port, a third resistor section provided between the ground port and the second output port, and a fourth resistor section provided between the power supply port and the second output port. The at least one magnetic detection element may include a plurality of first magnetic detection elements disposed in a first region and constituting the first resistor section, a plurality of second magnetic detection elements disposed in a second region and constituting the second resistor section, a plurality of third magnetic detection elements disposed in a third region and constituting the third resistor section, and a plurality of fourth magnetic detection elements disposed in a fourth region and constituting the fourth resistor section. The at least one magnetic field generator may be a plurality of magnetic field generators. The plurality of magnetic field generators may be disposed dividedly in the first area, the second area, the third area, and the fourth area. The ferromagnetic material section of each of the plurality of magnetic field generators disposed in two of the first, second, third, and fourth areas may have a first magnetization. The ferromagnetic material section of each of the plurality of magnetic field generators disposed in the other two of the first, second, third, and fourth areas may have a second magnetization. The first magnetization may include a component in a first direction. The second magnetization may include a component in a second direction opposite to the first direction.

In the magnetic sensor of the technology, the at least one inclined surface may include a first inclined surface and a second inclined surface each having a shape long in a direction parallel to the reference plane when seen in a direction perpendicular to the reference plane, the first and second inclined surfaces facing in respective different directions. The at least one magnetic detection element may include a plurality of first magnetic detection elements disposed on the first inclined surface and a plurality of second magnetic detection elements disposed on the second inclined surface. The at least one magnetic field generator may include a plurality of first magnetic field generators disposed on the first inclined surface and a plurality of second magnetic field generators disposed on the second inclined surface. The plurality of first magnetic detection elements may constitute a first detection circuit that detects a component of the target magnetic field in a first direction oblique to both the reference plane and a direction perpendicular to the reference plane and generates a first detection signal. The plurality of second magnetic detection elements may constitute a second detection circuit that detects a component of the target magnetic field in a second direction oblique to both the reference plane and the direction perpendicular to the reference plane and generates a second detection signal. The magnetic sensor of the technology may further include another support member having a flat surface, a plurality of third magnetic detection elements disposed on the flat surface, and a plurality of third magnetic field generators disposed on the flat surface and configured to generate a magnetic field to be applied to the plurality of third magnetic detection elements. The plurality of third magnetic detection elements may constitute a third detection circuit that detects a component of the target magnetic field in a third direction parallel to the reference plane and generates a third detection signal. The target magnetic field may be the Earth's magnetic field.

In the magnetic sensor of the technology, the target magnetic field may be a magnetic field generated by a current to be detected flowing through a conductor.

Obviously, many modifications and variations of the technology are possible in the light of the above teachings. Thus, it is to be understood that, within the scope of the appended claims and equivalents thereof, the technology may be practiced in other example embodiments than the foregoing example embodiments.

What is claimed is:

1. A magnetic sensor comprising:
a support member having at least one inclined surface inclined relative to a reference plane;
at least one magnetic detection element disposed on the at least one inclined surface and configured to detect a target magnetic field; and
at least one magnetic field generator disposed on the at least one inclined surface and configured to generate a magnetic field to be applied to the at least one magnetic detection element, wherein
the at least one magnetic field generator includes a ferromagnetic material section and an antiferromagnetic material section that is in contact with the ferromagnetic material section and is in exchange coupling with the ferromagnetic material section,
the ferromagnetic material section and the antiferromagnetic material section are stacked in a direction intersecting the at least one inclined surface,
the at least one magnetic detection element is at least one magnetoresistive element,
the at least one magnetoresistive element includes a magnetization pinned layer having a magnetization whose direction is fixed, a free layer having a magnetization whose direction is variable depending on the target magnetic field, and a gap layer located between the magnetization pinned layer and the free layer, and
the magnetization pinned layer is located between the at least one inclined surface and the gap layer.

2. The magnetic sensor according to claim 1, wherein the ferromagnetic material section and the antiferromagnetic material section each have a bottom surface opposed to the at least one inclined surface and inclined relative to the reference plane.

3. The magnetic sensor according to claim 1, wherein the at least one magnetic detection element includes a plurality of magnetic layers stacked in the direction intersecting the at least one inclined surface.

4. The magnetic sensor according to claim 1, wherein:
the at least one magnetic detection element has a first bottom surface shaped along the at least one inclined surface; and
the at least one magnetic field generator has a second bottom surface shaped along the at least one inclined surface and having substantially a same shape as a shape of the first bottom surface at least in part.

5. The magnetic sensor according to claim 1, wherein:
the at least one magnetic field generator includes a first magnetic field generator and a second magnetic field generator;
the ferromagnetic material section of the first magnetic field generator has a first magnetization;
the ferromagnetic material section of the second magnetic field generator has a second magnetization;
the first magnetization includes a component in a first direction; and
the second magnetization includes a component in a second direction different from the first direction.

6. The magnetic sensor according to claim 1, wherein:
the at least one magnetic field generator includes a first magnetic field generator and a second magnetic field generator; and
the first magnetic field generator and the second magnetic field generator are not disposed on a same plane.

7. The magnetic sensor according to claim 1, wherein:
the at least one magnetic detection element includes a first magnetic detection element and a second magnetic detection element; and
the first magnetic detection element and the second magnetic detection element are not disposed on a same plane.

8. The magnetic sensor according to claim 1, wherein:
the at least one inclined surface includes a specific inclined surface facing in a direction oblique to both the reference plane and a direction perpendicular to the reference plane;
the specific inclined surface has a shape long in a direction parallel to the reference plane when seen in the direction perpendicular to the reference plane; and
the at least one magnetic detection element includes two layered films disposed on the specific inclined surface and arranged in a direction intersecting a longitudinal direction of the specific inclined surface.

9. The magnetic sensor according to claim 1, further comprising:
a power supply port;
a ground port;
a first output port;
a second output port;
a first resistor section provided between the power supply port and the first output port;
a second resistor section provided between the ground port and the first output port;
a third resistor section provided between the ground port and the second output port; and
a fourth resistor section provided between the power supply port and the second output port, wherein
the at least one magnetic detection element includes a plurality of first magnetic detection elements disposed in a first area and constituting the first resistor section, a plurality of second magnetic detection elements disposed in a second area and constituting the second resistor section, a plurality of third magnetic detection elements disposed in a third area and constituting the third resistor section, and a plurality of fourth magnetic detection elements disposed in a fourth area and constituting the fourth resistor section,
the at least one magnetic field generator comprises a plurality of magnetic field generators,
the plurality of magnetic field generators are disposed dividedly in the first area, the second area, the third area, and the fourth area,
the ferromagnetic material section of each of the plurality of magnetic field generators disposed in two of the first, second, third, and fourth areas has a first magnetization,
the ferromagnetic material section of each of the plurality of magnetic field generators disposed in the other two of the first, second, third, and fourth areas has a second magnetization,
the first magnetization includes a component in a first direction, and
the second magnetization includes a component in a second direction opposite to the first direction.

10. The magnetic sensor according to claim 1, wherein the target magnetic field is a magnetic field generated by a current to be detected flowing through a conductor.

11. The magnetic sensor according to claim 1, wherein:
the at least one inclined surface has a shape long in a direction parallel to the reference plane when seen in a direction perpendicular to the reference plane; and
the at least one magnetic detection element has a shape long along a longitudinal direction of the at least one inclined surface.

12. The magnetic sensor according to claim 11, wherein:
the at least one magnetic detection element includes a specific magnetic detection element; and
the at least one magnetic field generator includes two specific magnetic field generators located on both sides of the specific magnetic detection element in a longitudinal direction of the specific magnetic detection element.

13. The magnetic sensor according to claim 11, wherein the at least one magnetic field generator includes a plurality of magnetic field generators disposed along the longitudinal direction of the at least one inclined surface.

14. The magnetic sensor according to claim 1, wherein:
the at least one inclined surface includes a first inclined surface and a second inclined surface each having a shape long in a direction parallel to the reference plane when seen in a direction perpendicular to the reference plane, the first and second inclined surfaces facing in respective different directions;
the at least one magnetic detection element includes a plurality of first magnetic detection elements disposed on the first inclined surface and a plurality of second magnetic detection elements disposed on the second inclined surface;
the at least one magnetic field generator includes a plurality of first magnetic field generators disposed on the first inclined surface and a plurality of second magnetic field generators disposed on the second inclined surface;
the plurality of first magnetic detection elements constitute a first detection circuit that detects a component of the target magnetic field in a first direction oblique to both the reference plane and a direction perpendicular to the reference plane and generates a first detection signal; and
the plurality of second magnetic detection elements constitute a second detection circuit that detects a component of the target magnetic field in a second direction oblique to both the reference plane and the direction perpendicular to the reference plane and generates a second detection signal.

15. The magnetic sensor according to claim 14, further comprising:
another support member having a flat surface;
a plurality of third magnetic detection elements disposed on the flat surface; and
a plurality of third magnetic field generators disposed on the flat surface and configured to generate a magnetic field to be applied to the plurality of third magnetic detection elements, wherein
the plurality of third magnetic detection elements constitute a third detection circuit that detects a component of the target magnetic field in a third direction parallel to the reference plane and generates a third detection signal.

16. The magnetic sensor according to claim 15, wherein the target magnetic field is an Earth's magnetic field.

17. A magnetic sensor comprising:
a support member having at least one inclined surface inclined relative to a reference plane;
at least one magnetic detection element disposed on the at least one inclined surface and configured to detect a target magnetic field;
at least one magnetic field generator disposed on the at least one inclined surface and configured to generate a magnetic field to be applied to the at least one magnetic detection element;
a power supply port;
a ground port;
a first output port;
a second output port;
a first resistor section provided between the power supply port and the first output port;
a second resistor section provided between the ground port and the first output port;
a third resistor section provided between the ground port and the second output port; and
a fourth resistor section provided between the power supply port and the second output port, wherein
the at least one magnetic field generator includes a ferromagnetic material section and an antiferromagnetic material section that is in contact with the ferromagnetic material section and is in exchange coupling with the ferromagnetic material section,
the ferromagnetic material section and the antiferromagnetic material section are stacked in a direction intersecting the at least one inclined surface,
the at least one magnetic detection element includes a plurality of first magnetic detection elements disposed in a first area and constituting the first resistor section, a plurality of second magnetic detection elements disposed in a second area and constituting the second resistor section, a plurality of third magnetic detection elements disposed in a third area and constituting the third resistor section, and a plurality of fourth magnetic detection elements disposed in a fourth area and constituting the fourth resistor section,
the at least one magnetic field generator comprises a plurality of magnetic field generators,
the plurality of magnetic field generators are disposed dividedly in the first area, the second area, the third area, and the fourth area,
the ferromagnetic material section of each of the plurality of magnetic field generators disposed in two of the first, second, third, and fourth areas has a first magnetization,
the ferromagnetic material section of each of the plurality of magnetic field generators disposed in the other two of the first, second, third, and fourth areas has a second magnetization,
the first magnetization includes a component in a first direction, and
the second magnetization includes a component in a second direction opposite to the first direction.

18. A magnetic sensor comprising:
a support member having at least one inclined surface inclined relative to a reference plane;
at least one magnetic detection element disposed on the at least one inclined surface and configured to detect a target magnetic field;
at least one magnetic field generator disposed on the at least one inclined surface and configured to generate a magnetic field to be applied to the at least one magnetic detection element;
another support member having a flat surface;

a plurality of third magnetic detection elements disposed on the flat surface; and a plurality of third magnetic field generators disposed on the flat surface and configured to generate a magnetic field to be applied to the plurality of third magnetic detection elements, wherein the at least one magnetic field generator includes a ferromagnetic material section and an antiferromagnetic material section that is in contact with the ferromagnetic material section and is in exchange coupling with the ferromagnetic material section, the ferromagnetic material section and the antiferromagnetic material section are stacked in a direction intersecting the at least one inclined surface, the at least one inclined surface includes a first inclined surface and a second inclined surface each having a shape long in a direction parallel to the reference plane when seen in a direction perpendicular to the reference plane, the first and second inclined surfaces facing in respective different directions, the at least one magnetic detection element includes a plurality of first magnetic detection elements disposed on the first inclined surface and a plurality of second magnetic detection elements disposed on the second inclined surface, the at least one magnetic field generator includes a plurality of first magnetic field generators disposed on the first inclined surface and a plurality of second magnetic field generators disposed on the second inclined surface, the plurality of first magnetic detection elements constitute a first detection circuit that detects a component of the target magnetic field in a first direction oblique to both the reference plane and a direction perpendicular to the reference plane and generates a first detection signal, the plurality of second magnetic detection elements constitute a second detection circuit that detects a component of the target magnetic field in a second direction oblique to both the reference plane and the direction perpendicular to the reference plane and generates a second detection signal, and the plurality of third magnetic detection elements constitute a third detection circuit that detects a component of the target magnetic field in a third direction parallel to the reference plane and generates a third detection signal.

* * * * *